US010627157B1

(12) United States Patent
Ruth et al.

(10) Patent No.: US 10,627,157 B1
(45) Date of Patent: Apr. 21, 2020

(54) CLIMATE CONTROLLED SMARTBOX

(71) Applicant: Motogo, LLC, Austin, TX (US)

(72) Inventors: David Brian Ruth, Austin, TX (US); Yuan-Chang Lo, Austin, TX (US)

(73) Assignee: MOTOGO, LLC, Austin, TX (US)

(*) Notice: Subject to any disclaimer, the term of this patent is extended or adjusted under 35 U.S.C. 154(b) by 0 days.

(21) Appl. No.: 16/265,817

(22) Filed: Feb. 1, 2019

Related U.S. Application Data

(60) Provisional application No. 62/625,827, filed on Feb. 2, 2018.

(51) Int. Cl.
F25D 29/00 (2006.01)
G05B 15/02 (2006.01)
G01R 31/382 (2019.01)

(52) U.S. Cl.
CPC ......... F25D 29/003 (2013.01); G01R 31/382 (2019.01); G05B 15/02 (2013.01); F25D 2700/12 (2013.01)

(58) Field of Classification Search
CPC . F25D 29/003; F25D 2700/12; G01R 31/382; G05B 15/02
USPC .................................................. 700/290–300
See application file for complete search history.

(56) References Cited

U.S. PATENT DOCUMENTS

| 5,872,721 | A  | * | 2/1999  | Huston     | A23B 7/148  |
|           |    |   |         |            | 62/150      |
| 6,704,618 | B1 | * | 3/2004  | Moritz     | B64D 1/02   |
|           |    |   |         |            | 244/136     |
| 2005/0232747 | A1 | * | 10/2005 | Brackmann | B60P 3/03   |
|           |    |   |         |            | 414/803     |
| 2008/0297346 | A1 | * | 12/2008 | Brackmann | B60P 3/03   |
|           |    |   |         |            | 340/572.1   |
| 2010/0253519 | A1 | * | 10/2010 | Brackmann | B60P 3/03   |
|           |    |   |         |            | 340/572.1   |
| 2012/0006369 | A1 | * | 1/2012  | Cantin    | E04B 1/34305|
|           |    |   |         |            | 135/96      |
| 2012/0206093 | A1 | * | 8/2012  | Schaefer  | H02J 7/0042 |
|           |    |   |         |            | 320/107     |
| 2013/0289927 | A1 | * | 10/2013 | Smith     | G06F 17/18  |
|           |    |   |         |            | 702/130     |
| 2015/0204561 | A1 | * | 7/2015  | Sadwick   | G05D 23/1905|
|           |    |   |         |            | 236/1 C     |
| 2017/0108261 | A1 | * | 4/2017  | Broussard | F25D 11/003 |

* cited by examiner

*Primary Examiner* — Ziaul Karim
(74) *Attorney, Agent, or Firm* — Moore IP Law

(57) ABSTRACT

A climate controlled smartbox includes a battery, a sensor configured to detect a property of a medium of the smartbox, a climate control interface configured to change the property, and a controller. The controller is configured to receive a first indication of a charge of the battery, receive from the sensor a second indication of the property, and determine a control input for the climate control interface based on the first indication and the second indication.

20 Claims, 11 Drawing Sheets

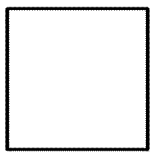

 No locking infrastructure, human pickup from delivery vehicle, robot or drone delivery to location or human on property, or deliver to nearby community locking infrastructure

 Locking infrastructure at street, secure delivery to anchor. Also possible: robot or drone delivery to location or human on property, or deliver to nearby community locking infrastructure

 Off street locking infrastructure on property: robot or drone delivery to location on property and secure delivery to anchor, or human on property or deliver to nearby community locking infrastructure

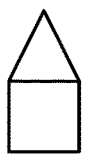 Local delivery Robot (LDR) available on property which meets the delivery vehicle for the secure transfer and it then LDR makes delivery to local secure infrastructure or humans on property

 Deliver to local anchored structure (per above), then Local Delivery Robot (LDR), when available at property, accesses package(s) and makes final delivery to local secure infrastructure or humans on property

FIG. 3

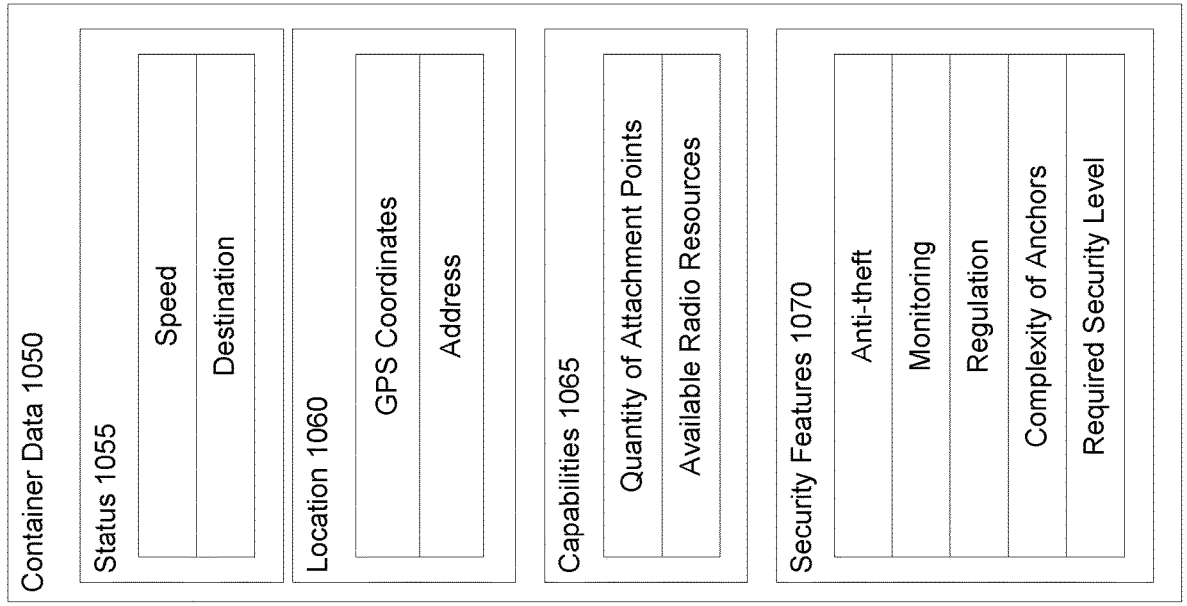
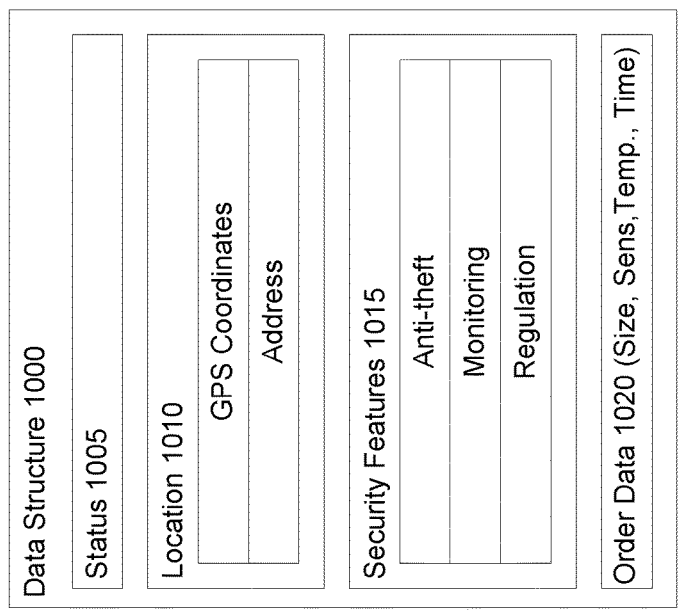
FIG. 10

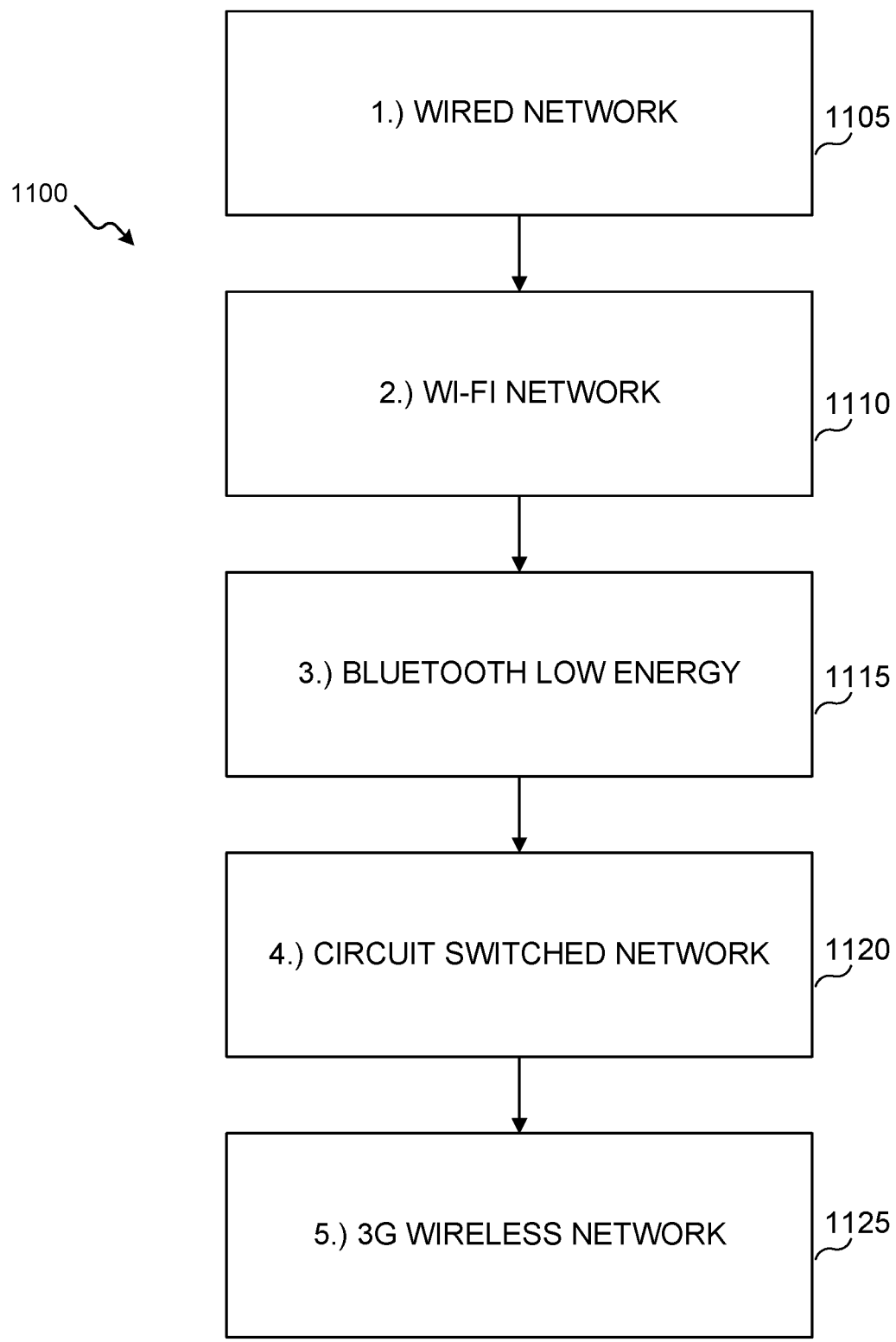

CLIMATE CONTROLLED SMARTBOX

CROSS-REFERENCE TO RELATED APPLICATIONS

The present application claims priority from U.S. Provisional Patent Application No. 62/625,827, filed Feb. 2, 2018, entitled "APPARATUS AND METHOD FOR POWER MANAGEMENT IN A CLIMATE CONTROLLED SMARTBOX," which is incorporated by reference in its entirety.

TECHNICAL FIELD

This disclosure relates generally to power management of nodes of networked systems. More specifically, this disclosure relates to an apparatus and method for power management in a climate controlled smartbox.

BACKGROUND

The deployment of secure, network-connected and/or climate controlled containers, sometimes known as "smartboxes," within a network of distribution nodes (for example, secure storage areas within homes, garages, and dropboxes) and distribution vectors (for example, autonomous vehicles or "drones"), presents numerous unresolved technical challenges. Technical challenges associated with full-scale smartbox deployment and realization of the possibilities of a smartbox-based distribution network (for example, context responsive pre-deployment of fresh food in anticipation of customer orders) include optimizing power management of the smartbox. A typical container used by a delivery party for the transport of contents, from a purveyor to a customer, may fail to adequately or optimally monitor a condition of the contents. The food purveyor and the customer may not have knowledge of how long the contents have been in transit or the kinds of temperature excursions the contents may have experienced. If the contents include food, a transporter party may not know when the food has been processed (e.g., cooked) or the condition in which the food has been kept. Further, a food purveyor and a food transporter may not know when a food purchaser consumed the food or how the food was kept before consumption. Consequently, should a health or damages issue arise from use of spoiled or compromised contents, it may be difficult to hold a party accountable. In the case of food delivery, containers used by restaurants or other providers may include only nominal insulation, providing only passive temperature preservation and introducing a likelihood of quality degradation to the contents. Further, the food purchaser is typically required to be present to receive the contents to ensure freshness and food safety, introducing a degree of inconvenience to the customer.

SUMMARY

This disclosure provides a smartbox or a climate controlled smartbox. The smartbox may comprise a battery, a sensor configured to detect a property of a medium of the smartbox, a climate control interface configured to change the property, and a controller. The controller may be configured to receive a first indication of a charge of the battery, receive from the sensor a second indication of the property, and determine a control input for the climate control interface based on the first indication and the second indication. The controller may further be configured to receive from a control server, via a network interface, one or more operating parameters for the smartbox and to determine the control input based further on the one or more operating parameters. The climate control interface may comprise one or more of a flapper valve, a shutter, a heater, or a refrigerator.

A method according to this disclosure can comprise receiving a first indication of a charge of a battery of a smartbox, receiving from a sensor of the smartbox a second indication of a property of a medium of the smartbox, and determining at the smartbox a control input for a climate control interface of the smartbox based on the first indication and the second indication, wherein the climate control interface is configured to change the property. The method may further comprise receiving from a control server via a network interface of the smartbox an operating parameter, and the determining of the control input may be based further on the operating parameter.

A device according to the disclosure may store instructions that, when executed, cause a processor to initiate or perform operations comprising receiving a first indication of a charge of a battery of a smartbox, receiving from a sensor of the smartbox a second indication of a property of a medium of the smartbox, and determining a control input for a climate control interface of the smartbox. The determining of the control input may be based on the first indication and the second indication, and the climate control interface may be configured to change the property.

In a first particular embodiment, the climate controlled smartbox includes an electrochemical cell (e.g., a battery) and a resealable storage enclosure holding a volume of a non-toxic medium, wherein the resealable storage enclosure includes a climate control interface for changing a property of the non-toxic fluid medium. Further, the smartbox includes send and receive circuitry, including a network interface. Additionally, the smartbox includes a processor and a memory, the memory containing instructions, which when executed, cause the processor to receive, from the charge sensor, an indication (e.g., a time stamped indication) of a charge stored in the electrochemical cell, store the indication of the stored charge in the memory, receive, via the network interface, from a control server, a value (e.g., a time stamped value) of an operating parameter for the smartbox, store the received operating parameter in the memory, receive from a climate sensor, a value (e.g., a time stamped value) of the property of the non-toxic fluid medium, store the value of the property of the non-toxic fluid medium, determine a control input for the climate control interface based on at least one of the operating parameter, the value of the property of the non-toxic fluid medium, or the time stamped value of the stored charge. Additionally, the memory contains instructions, which when executed, cause the processor to control the climate control interface. Additionally, in a first embodiment, the send and receive circuitry is configured to be powered by the charge from the electrochemical cell.

In a second embodiment, a method of power management in a climate controlled smartbox includes receiving, at a processor, from a charge sensor in the smartbox, an indication (e.g., a time stamped indication) of a charge of an electrochemical cell, the smartbox comprising a resealable storage enclosure including a climate control interface, a climate sensor, and a volume of a non-toxic fluid medium, the climate control interface configured to change a property of the non-toxic fluid medium, send and receive circuitry including a network interface, and a memory. Additionally, the method includes storing the indication of the charge of the electrochemical cell in the memory, receiving, from a control server via the network interface, a value (e.g., a time stamped value) of an operating parameter for the smartbox, wherein the climate control interface, the processor, and a transceiver of the smartbox are configured to be powered by the charge from the electrochemical cell, storing the value of the operating parameter in the memory, receiving, from the climate sensor, a value (e.g., a time stamped value) of the property of the non-toxic fluid medium, storing the value of the property of the non-toxic fluid medium in the memory, determining a control input for the climate control interface based on the operating parameter, the value of the property of the non-toxic fluid medium, and the time stamped value of the stored charge, and controlling the climate control interface according to the determined control input.

In a third embodiment, a control server for a climate controlled smartbox includes a network interface communicatively connecting the control server to the climate controlled smartbox. Additionally, the control server includes a processor and a memory containing instructions, which when executed by the processor, cause the control server to receive, via the network interface, a value (e.g., a time stamped value) of a measured parameter of the smartbox, determine a time stamped estimate of the remaining charge in an electrochemical cell of the smartbox, determine a time stamped value of an operating parameter of the smartbox based on the time stamped value of the measured parameter and the time stamped estimate of the remaining charge in the electrochemical cell, and transmit, via the network interface, the determined operating parameter.

In a fourth embodiment, a method of power management for a climate controlled smartbox includes receiving, by a control server, from a climate controlled smartbox, via a network interface, a value (e.g., a time stamped value) of a measured parameter of the smartbox. Additionally, the method includes determining an estimate (e.g., a time stamped estimate) of the remaining charge in an electrochemical cell of the smartbox, determining an operating parameter (e.g., a time stamped operating parameter) of the smartbox based on the value of the measured parameter and the estimate of the remaining charge in the electrochemical cell, and transmitting, via the network, the determined operating parameter.

In a fifth embodiment, a non-transitory computer-readable medium includes program code, which when executed by a processor, causes a climate controlled smartbox to receive, at a first processor, from a charge sensor in the smartbox, an indication (e.g., a time stamped indication) of a charge of an electrochemical cell, the smartbox comprising send and receive circuitry including a network interface, a memory, a charge sensor, and a resealable storage enclosure including a climate control interface, a climate sensor, and a volume of a non-toxic fluid medium, wherein the climate control interface is configured to change, via the climate control interface, a property of the non-toxic fluid medium. Additionally, the non-transitory computer-readable medium also includes program code, which when executed by the processor, causes the smartbox to store the indication of the charge of the electrochemical cell in the memory, receive, from a control server via the network interface, a value (e.g., a time stamped value) of an operating parameter for the smartbox, wherein climate control interface, the first processor, and the send and receive circuitry are configured to be powered by the charge from the electrochemical cell, store the value of the operating parameter in the memory, receive, from the climate sensor, a value (e.g., a time stamped value) of the property of the non-toxic fluid medium, store the value of the property of the non-toxic fluid medium in the memory, determine a control input for the climate control interface based on the operating parameter, the value of the property of the non-toxic fluid medium, and the time stamped value of the stored charge, and control the climate control interface according to the determined control input.

In a sixth embodiment, a non-transitory computer-readable medium includes program code, which when executed by a processor, causes a control server to receive, from a climate controlled smartbox, via a network interface, a value (e.g., a time stamped value) of a measured parameter of the smartbox. Additionally, the non-transitory computer-readable medium includes program code, which when executed by the processor, causes the control server to determine an estimate (e.g., a time stamped estimate) of the remaining charge in an electrochemical cell of the smartbox, determine an operating parameter (e.g., a time stamped operating parameter) of the smartbox based on the value of the measured parameter and the estimate of the remaining charge in the electrochemical cell, and transmit, via the network, the determined operating parameter.

Other technical features may be readily apparent to one skilled in the art from the following figures, descriptions, and claims.

Before undertaking the DETAILED DESCRIPTION below, it may be advantageous to set forth definitions of certain words and phrases used throughout this document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The terms "embodiments" and "examples" refer to certain embodiments of the disclosure and certain examples of the disclosure, respectively. The phrase "at least one of," when used with a list of items, means that different combinations of one or more of the listed items may be used, and only one item in the list may be needed. For example, "at least one of: A, B, and C" includes any of the following elements or combinations: A; B; C; A and B; A and C; B and C; and A, B, and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

Definitions for other certain words and phrases are provided throughout this document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which:

FIG. 3 illustrates several smartbox delivery contexts according to embodiments of this disclosure;

FIG. 10 illustrates data structures for power management in a climate controlled smartbox according to embodiments of this disclosure; and FIG. 11 illustrates power management logic for radio frequency (RF) signaling according to embodiments of this disclosure.

DETAILED DESCRIPTION

Figure 1:
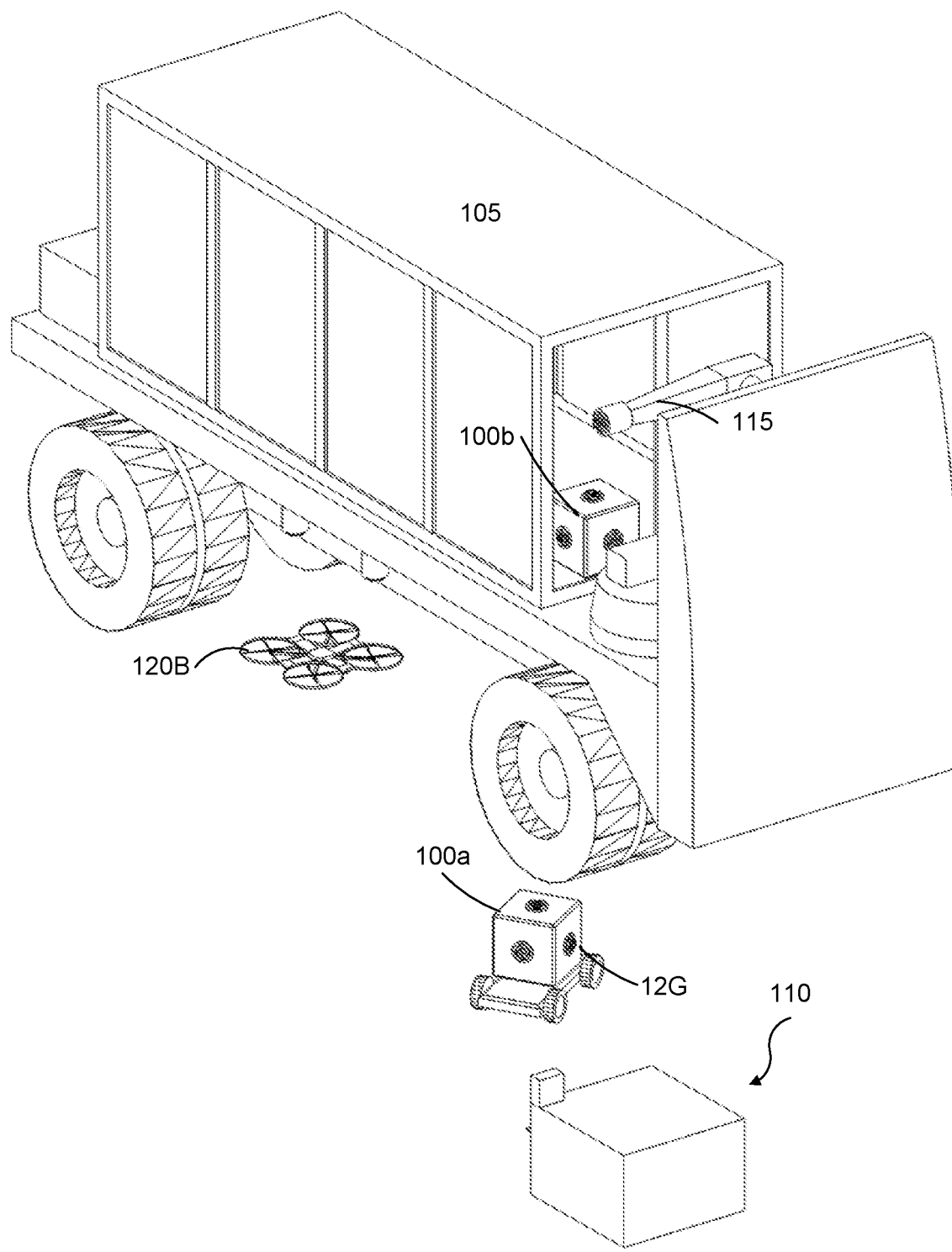
FIG. 1 illustrates examples of smartbox, storage, and delivery apparatuses according to embodiments of this disclosure.

FIGS. 1-11, as referenced below, and the various embodiments used to describe the principles of this disclosure in this document are by way of illustration only and should not be construed in any way to limit the scope of the disclosure. Those skilled in the art will understand that the principles of this disclosure may be implemented in any suitably arranged wireless communication system. FIG. 1 illustrates example of smartbox, storage, and delivery apparatuses according to embodiments of this disclosure. According to embodiments, smartboxes 100a and 100b are secure containers for transporting contents (e.g., perishables such as foods, or drugs/medications) in a climate controlled environment comprising a non-toxic fluid medium, such as air or water. In the example of FIG. 1, smartbox 100a includes motorized wheels and is equipped for autonomous, self-propelled transport, such as from a delivery vehicle 105 to secure staging location 110. In embodiments, smartbox 100b is configured to be loaded, such as by a robotic arm 115 on the delivery vehicle 105 to another delivery vehicle, such as another instance of delivery vehicle 105 or, according to embodiments, an autonomous, flying delivery vehicle or "drone" 120B.

In the example of FIG. 1, smartbox 100a includes climate control interface 12G for regulating a property of a content or fluid medium inside the smartbox. According to embodiments, smartbox 100a includes a processor and a memory, the memory containing instructions, which when executed by the processor, control the operation of climate control interface 12G. In embodiments, climate control interface 12G is a port, which, when smartbox 100a is "docked" in, for example, delivery vehicle 105 or staging location 110, opens to connect smartbox 100a to a companion climate control interface in staging location 110 or delivery vehicle 105, and allows at least one property (for example, temperature, humidity, concentrations of atmospheric particulates (for example, barbecue smoke)) of the fluid medium in smartbox 100a to be controlled.

In other embodiments, the climate control interface 12G may be self-contained and further include a heater, refrigerator, humidifier, or other apparatus for adjusting a property of a fluid medium contained in smartbox 100a.

According to embodiments, smartboxes (e.g., 110a and 100b) can be deployed and managed (e.g., in part) by control logic located at, for example, a control server (e.g., control server 700 shown in FIG. 7) and/or located at one or more smartboxes (e.g., 110a and 110b). The term "control logic" means any device, system, or part thereof that controls at least one operation. Such control logic may be implemented in hardware or a combination of hardware and software and/or firmware. The functionality associated with control logic may be centralized and/or distributed, whether locally or remotely. Control logic functionality (e.g., functionality of control server 700) can be architecturally distributed among smartboxes and/or server compute resources located in data centers, the cloud, or within transportation resources such as delivery vehicles. According to embodiments, one or more smartboxes (e.g., smartboxes 100a and 100b) can operate autonomously of a control server and/or can include part or all of the control server functionality (e.g., as part of the smartbox's existing processing functions). According to other embodiments, smartboxes 100a and 100b can operate based on control inputs received from mobile terminals (for example, smartphones, tablets, laptop computers, and IoT devices).

System architectures according to embodiments can be leveraged to provide improved functionality in the way goods, including foodstuffs, are stored and delivered to end users. Smartboxes according to embodiments maintain and adjust a property volume of the non-toxic liquid medium within the smartbox according to predetermined rules, while efficiently managing energy usage for climate control, computation, and network signaling, thereby optimizing an amount of time they can be deployed in the field. Practical benefits of this technology may include an ability to put food for delivery in a smartbox and deploy the smartbox to an area where an order is predicted to be received, while maintaining the appropriate property of the non-toxic liquid medium, and an ability to deliver food to a customer without requiring the customer to be present to receive the delivery, as a state of freshness of the contents can be preserved longer by virtue of maintenance of the property. In this way, food can be delivered hotter and quicker than if it were delivered from a central staging point, such as a restaurant or commissary.

Embodiments of systems and methods according to this disclosure may provide the ability to store multiple types of foods in one or more smartboxes, thereby enabling orders to be modified after entry. Other applications include configuring an artificial intelligence (AI) engine at either the control server or the smartbox to apply rules or machine learned inferences to anticipate future transactions and act in response to anticipated behavior. According to one example, a control server may aggregate data, or receive aggregated data (for example, by web scraping) of events or information in the service area of a smartbox. In one example, the control server may aggregate information regarding sporting events in the area, and determine that a significant event (for example, a college football game) is occurring in the service area of one or more smartboxes under its control. Through the application of rules developed through an AI learning model, the control server may dispatch one or more smartboxes containing foodstuffs (e.g., hamburgers, alcoholic beverages, etc. determined based on rules and models associated with customers in a vicinity of the college football game).

Embodiments may provide, through the use of a rules engine at a smartbox and/or a control server, automatically selected and delivered meals for a family. For example, embodiments may, in response to a determination by an AI engine in a smartbox or control server, or in response to a recurring order placed by a user, deliver a particular meal or ingredients for a meal to an end user. For example, systems according to embodiments, know that Thursdays are "taco night" for the Smith family residing at 123 Main Street, and deliver time sensitive ingredients, such as fresh guacamole and hot taco fillings to the Smith residence at a predetermined time. In this example, because the smartbox is both networked and able to maintain a property of a non-toxic fluid medium inside the smartbox, the smartbox may be able to anticipate and adjust for contextual changes in the order, such as the expected arrival time of the Smith family at their house, based on received information regarding their position (such as from a smartphone) and aggregated data (such as traffic information).

Certain embodiments of systems and methods according to this disclosure may provide improvements in the speed and assurances of security associated with the delivery of foods subject to restrictions on their preparation and handling. Certain foods (for example, Glatt Kosher or Halal foods) must, in order to be designated as such, satisfy certain custodial requirements. Smartboxes according to embodiments are equipped with an electronically controlled lock and can generate highly reliable indicia (for example, by generating blockchains of GPS data) as to when and where the lock has been opened and closed. In this way, a secure chain of custody needed for designation as, for example "Glatt Kosher" or "Halal," may be achieved. Other applications for smartboxes according to this disclosure which can provide an assured chain of custody include smartboxes for delivering foodstuffs to individuals with allergies, such as life-threatening nut allergies.

Systems and methods according to embodiments provide the ability to cook or prepare the contents of the smartbox prior to receiving an order. For example, smartboxes according to embodiments of this disclosure may comprise a heater, and the non-toxic liquid medium contained in the smartbox may be water. Accordingly, such smartboxes may be deployed or dispatched to an area corresponding to a predicted order (such as near a restaurant, home or other place where sous vide cooked foods are expected to be needed) and can be slowly cooked in anticipation of an order. In this way, a dish, such as a steak, may be dispatched during a time when traffic is low or delivery is otherwise convenient, yet be in place and ready for use at a time when traffic is high (e.g., in the early evening) or when delivery is inconvenient.

Additionally, systems and methods according to this disclosure enable the deployment of smartboxes on autonomous vehicles (AVs), wherein the smartboxes include, within a secure, climate controlled enclosure, premeasured ingredients for one or more meals. According to embodiments, smartboxes mounted on autonomous vehicles can be dispatched to an algorithmically selected service area (for example, a neighborhood, a college campus, or a suitably accessible building) in anticipation of a potential order. Upon receipt of an order for ingredients for a specific meal, the smartbox can assemble the necessary ingredients for the meal and package them for delivery to an end customer.

Figure 2:
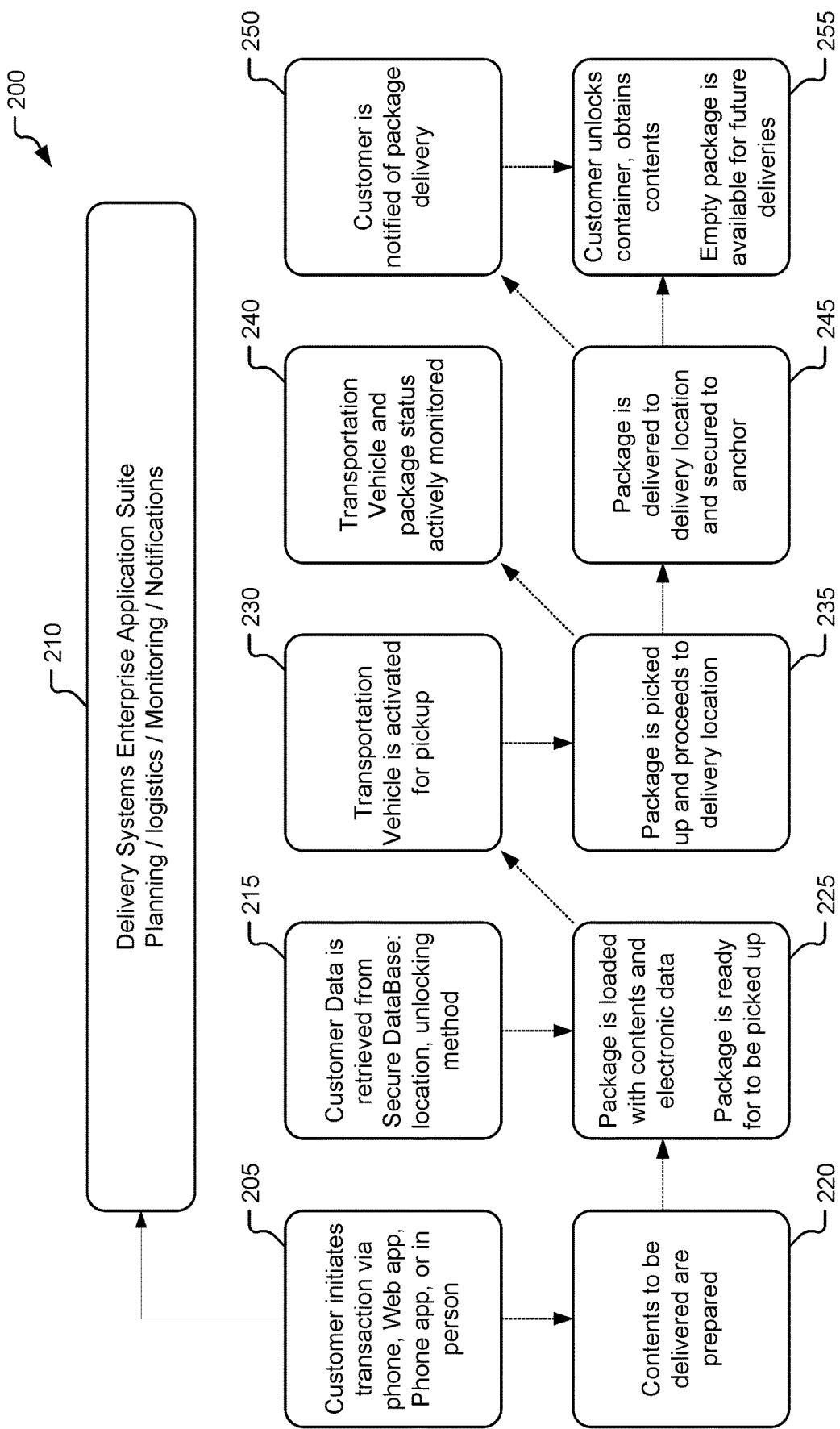
FIG. 2 illustrates an example of a smartbox deployment workflow according to embodiments of this disclosure.

FIG. 2 illustrates an example of a workflow 200 for smartbox deployment according to embodiments. The workflow 200 begins at operation 205, wherein a user, in this case, a customer, initiates a transaction requiring a climate controlled smartbox according to embodiments. In embodiments, initiation of a transaction at operation 205 comprises placing an order for a good to be delivered using a smartbox. Depending on embodiments, the order is placed via at least one of a telephone call, a web application, a mobile application, or in person, at a point of presence of a smartbox network. Points of presence of the smartbox network include retail locations of the network, automatic terminals (for example, devices such as a Redbox® terminal for video rental or an Amazon Prime® Locker), or a smartbox itself. In the example of FIG. 2, initiating a transaction includes transmitting, via a network, a digital identifier of the customer and a digital identifier of the ordered goods to a delivery system enterprise application suite 210. Initiating the transaction at operation 205 may comprise transmitting, via a network, digital identifiers of one or more parameters associated with the transaction, such as a delivery time, substitution parameters, or payment information, such as an encrypted credit card number.

Figure 7:
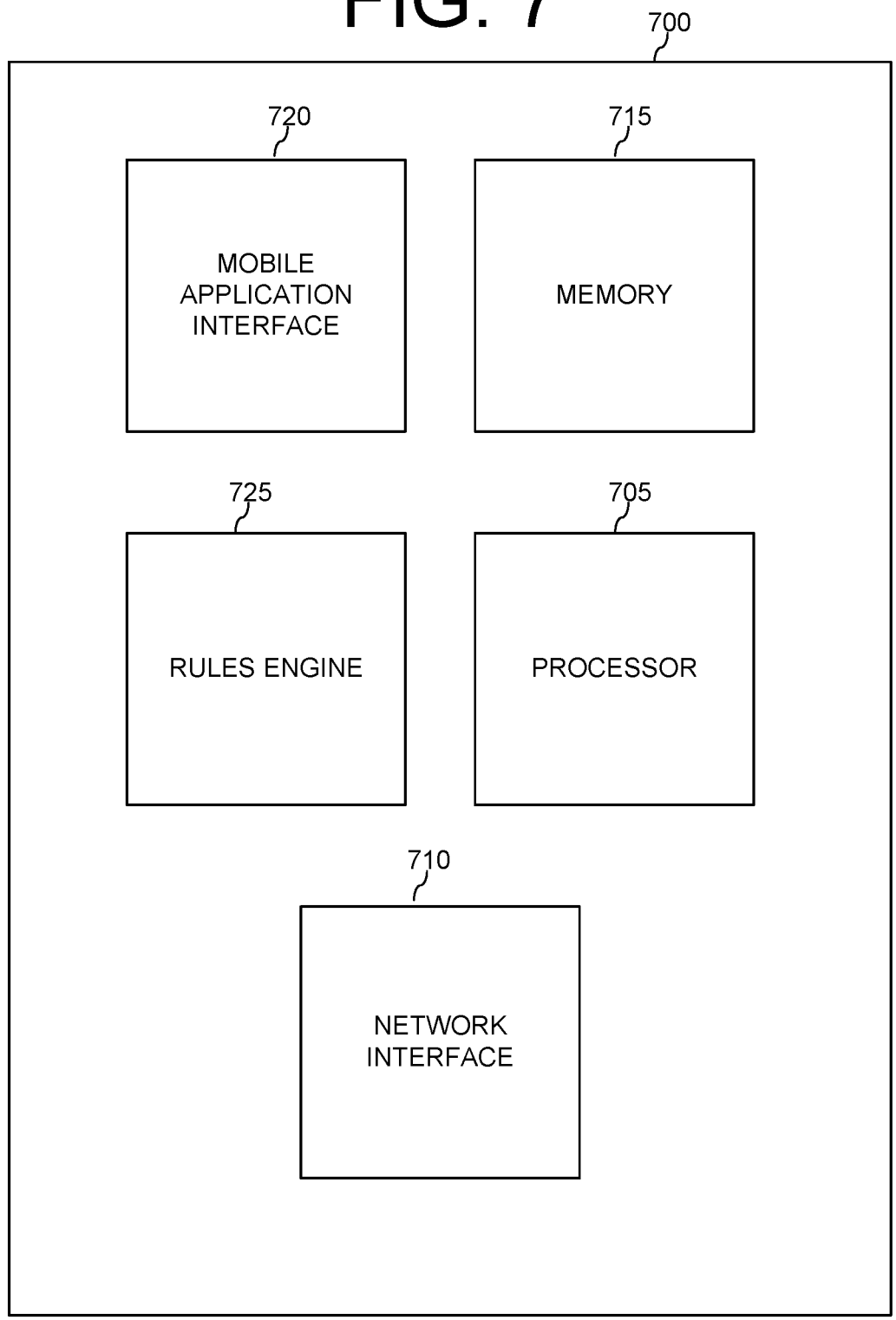
FIG. 7 illustrates an example of a control server according to embodiments of this disclosure.

According to embodiments, part or all of delivery systems enterprise application suite 210 and/or control logic functionality may be embodied as program code on a non-transitory computer readable medium of a smartbox (for example, smartbox 110a shown in FIG. 1) and/or a control server (for example, control server 700 shown in FIG. 7). A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device. Delivery system enterprise application suite 210 may, according to embodiments, perform front-end operations of a network of smartboxes (e.g., connected to a control server and/or including control logic functionality). Such operations may include receiving, via a web or mobile interface, orders, publishing, again, via a web or mobile interface, status information of an order as well as notifications relating to same. According to other embodiments, delivery system enterprise application suite 210 may also perform back-end operations of a network of smartboxes (e.g., connected to a control server and/or including control logic functionality). Such back-end operations include monitoring the status of orders, monitoring the location and status of smartboxes, aggregating and processing contextual data, and implementing a rules engine.

In FIG. 2, at operation 215, delivery system enterprise application suite 210 authenticates one or more of the food purveyor, the food transporter, or the customer and transmits instructions to a current custodian of the smartbox as well as a vendor or custodian of the contents to be provisioned by the smartbox. Further, according to embodiments, customer data is retrieved from a secure database, and this customer data is provided to delivery system enterprise application suite 210 to be used by control logic of the smartbox and/or of a control server.

According to embodiments, at operation 220, the vendor or custodian of contents to be delivered by the smartbox receives notification to prepare the contents. In embodiments, the notification received by the vendor may be sent from delivery system enterprise application suite 210. In other embodiments, this notification may be received directly from the customer's mobile terminal. According to still other embodiments, this notification may be received from a server hosting the web interface from which the transaction was initiated at operation 205. Numerous embodiments are possible and within the scope of this disclosure. In the example of FIG. 2, the contents to be delivered are prepared. This preparation may comprise pre-cooking a dish to be ordered, portioning a dish to be ordered, or assembling a dish to be cooked while en route for delivery.

According to embodiments, at operation 225, the package, or smartbox, is made ready for pickup. In the example of FIG. 2, preparation for pickup comprises loading the smartbox with the contents to be delivered, and loading a memory on the smartbox with data specific to the delivery. According to embodiments, data loaded at operation 225 includes a digital signifier of the contents, a digital signifier of a parameter associated with the delivery, a terminal condition (for example, a temperature at which the contents must be at when delivered), a time stamped value indicating when the contents were loaded into the smartbox, a value of a useful life or utility window (e.g., shelf life) of the contents, a digital signifier of one or more categories to which the contents belong, a destination address, a time stamped value indicating when the smartbox was locked, or trusted digital evidence (for example, a blockchain entry or data signed with the public key of the delivery system enterprise application suite 210) of a chain of custody.

In embodiments, at operation 230, a transportation vehicle is activated to pick up the smartbox. In embodiments, the transportation vehicle may be the smartbox itself (such as smartbox 100*a* shown in FIG. 1). In an example, the transportation vehicle may be an autonomous delivery vehicle (for example, vehicles 105 and 120B shown in FIG. 1). According to other embodiments, the transportation vehicle may be a human delivery person, or a manned vehicle, such as a delivery truck. According to embodiments, activation of the delivery vehicle comprises loading delivery coordinates into the delivery vehicle, calculating a necessary charge to perform the delivery and/or charging the delivery vehicle.

In the example of FIG. 2, at operation 235, the package is picked up and loaded (e.g., via a robotic arm) onto the transportation vehicle, which then proceeds to the delivery location. According to embodiments, proceeding to the delivery location includes stops at various waypoints, such as staging areas (for example, staging location 110 shown in FIG. 1). In embodiments, such as embodiments wherein the smartbox is equipped to portion out its contents, or wherein the smartbox contains multiple items for delivery, multiple delivery locations may be specified. In an example, the delivery location may be a point in a neighborhood or locality where the smartbox is to be placed in anticipation of an expected order or specification of a final delivery address.

According to embodiments, at operation 240, a status of the transportation vehicle and the smartbox are monitored. According to embodiments, monitoring a status of the smartbox and transportation vehicle includes monitoring, via GPS information, the location of both the smartbox and the transportation vehicle, monitoring charge status of one or more electrochemical cells of the smartbox or transportation vehicle, monitoring a measured property of a non-toxic medium contained in the smartbox, or monitoring connectivity status (for example, identifying networks or communication protocols available to the smartbox or transportation vehicle). In embodiments, such as for, example, where the smartbox has sufficient power resources, monitoring the smartbox's status may be performed actively or continuously, so as to provide control logic at, for example, one or more of a control server or delivery system enterprise application suite 210 with up-to-the-minute information. In other embodiments, such as for example, where the power resources are low, or where the smartbox may be expected to operate for a long or indeterminate period of time under the power provided by its own electrochemical cell or cells (e.g., battery or batteries), the monitoring performed at operation 240 may be periodic or asynchronous, so as to minimize the computational or signaling load at the smartbox, thereby conserving power resources of the smartbox.

According to embodiments, at operation 245, the smartbox is delivered to its location or destination and secured to the delivery point by a locking device disposed on an outside of the smartbox. According to embodiments, the locking mechanism attaching the smartbox to the anchor point comprises an embodiment of the locking mechanisms described in U.S. Pat. No. 9,842,449, the entirety of which is incorporated herein by reference. In the example of FIG. 2, as part of operation 245, the smartbox updates a data structure (for example a blockchain created or updated as part of operation 225) recording the chain of custody of the smartbox. In an example, at operation 245, the smartbox sends an encrypted message to control logic (e.g., a control server) and/or delivery system enterprise application suite 210. Depending on the encryption method used, the encryption of the message provides trustworthy evidence of the message's authenticity.

At operation 250, the customer is notified that the smartbox was delivered at operation 245. In embodiments, the notification may include information on how long the food will keep fresh, may be updated as a condition such as a weather condition at the customer location changes and/or may be provided as a message sent from delivery system enterprise application suite 210 to a web application or mobile application.

In the example of FIG. 2, at operation 255, the customer unlocks the smartbox and obtains the contents. According to embodiments, the customer unlocks the smartbox by entering a code on a keypad provided by the smartbox. According to other embodiments, the customer unlocks the smartbox by providing biometric data (such as a fingerprint, voice print, face scan, or iris scan) to one or more sensors of the smartbox. In an example, the smartbox is unlocked through a customer's interaction with an associated application on a mobile terminal. In still other embodiments, the smartbox is unlocked in response to a determination of proximity to a trusted device, such as an RFID tag or a mobile terminal. Numerous variations are possible and within the scope of this disclosure.

FIG. 3 illustrates several smartbox delivery contexts according to embodiments. The example of FIG. 3 provides a representation of a street, wherein the street includes five delivery contexts 310-330 to which a smartbox according to embodiments may be delivered. Five corresponding locations present delivery contexts to which a smartbox according to this disclosure can maintain its contents in a secure, climate controlled manner.

As shown in the example of FIG. 3, smartboxes according to embodiments can perform a delivery operation (for example, operation 245 shown in FIG. 2) according to a first delivery context 310. In embodiments, a transportation vehicle, such as a truck, a flying drone, or an autonomous land vehicle, brings the smartbox to a specified address. In this example, delivery context 310 can present challenges from both a security and a climate control perspective to the integrity of the contents. For example, if the contents include valuable and climactically sensitive items (e.g., food such as sushi) or drugs/medications, it may be undesirable to leave the contents in an open or exposed location. Smartboxes according to embodiments may recognize a delivery location as presenting delivery context 310 and apply a predetermined rule to, for example, information regarding the current temperature of the contents and the smartbox's prediction as to how long it can maintain a suitable climate within the smartbox. Depending on the determination, the smartbox may transmit a signal to a server, such as control server 700 in FIG. 7, reminding a human customer to come retrieve the contents. According to other embodiments, the control logic of the smartbox (e.g., in conjunction with the delivery systems enterprise application suite 210) may determine an alternative delivery point, such as a community locking infrastructure, where the smartbox can ensure the security and climate requirements of its contents with its available power.

In the example of FIG. 3, smartboxes according to embodiments can perform a delivery operation in a second delivery context 315, where suitable locking infrastructure, such as a hardened anchor point or a staging point (such as staging location 110 shown in FIG. 1) is provided. According to embodiments, upon being delivered to delivery context 315, the smartbox performs a determination as to how long it can maintain the contents under suitable climate control conditions at the locking infrastructure. According to embodiments, the smartbox revises an initial estimate of its power requirements based on information regarding the available locking infrastructure. For example, if the smartbox determines that it has been delivered to a covered staging location (such as staging location 110 shown in FIG. 1), based on predetermined rules, it adjusts its power requirements for maintaining the security and climactic integrity of the contents downwards, as it is now out of the sun and may not need to power an electronically controlled lock.

In the example of FIG. 3, smartboxes according to embodiments can also perform deliveries in a third delivery context 320. In third delivery context 320, the smartbox is delivered to a location where there is on-site or off-site locking infrastructure on the property. For example, an on-site locking infrastructure may include a location that is not adjacent to a street or roadway or a location at a front or back door of a home. According to embodiments, the smartbox is delivered to the anchor by a drone or other autonomous vehicle.

Further, in the example of FIG. 3, smartboxes according to embodiments can perform deliveries in a fourth delivery context 325. In fourth delivery context 325, the smartbox is delivered to the address and signals its arrival to a local delivery robot on or near the property, which provides "last mile" delivery functionality to a secure infrastructure or authenticated human on the property. The local delivery robot may be transported to the delivery location upon a delivery vehicle. In other words, at the delivery location, the local delivery robot may "jump" off the delivery vehicle and perform one or more deliveries and then return or rejoin the same or another delivery vehicle.

Additionally, in the example of FIG. 3, smartboxes according to embodiments can perform deliveries in a fifth delivery context 330. Smartboxes according to embodiments may be configured to be delivered to a local anchored structure of the delivery address. Upon arrival, a local delivery robot, such as a drone, or small autonomous vehicle, may not be available. Upon determining that a local delivery vehicle is not yet available, smartboxes according to embodiments may, by performing a determination based on the application of predetermined rules to at least one of a time stamped value of the available charge in an electrochemical cell of the smartbox, a utility window of the contents, information about the expected availability of local delivery vehicles, or a forecast of the expected power demands for climate control and signaling of the smartbox, perform a determination as to whether to wait at the local anchored structure for the arrival of a local delivery robot, or request that the delivery vehicle take the smartbox to a different location where the security and climactic requirements of its contents may be better met. According to embodiments, the smartbox may, in delivery context 330, send a message to at least one of a control server or customer mobile terminal to notify a customer that the smartbox is anchored to the local anchored structure and is awaiting "last mile" transport by a local delivery robot. The above-discussed examples of delivery contexts 310-330 are for illustration only, and are not intended as limitative as to the scope of the present disclosure.

Figure 4:
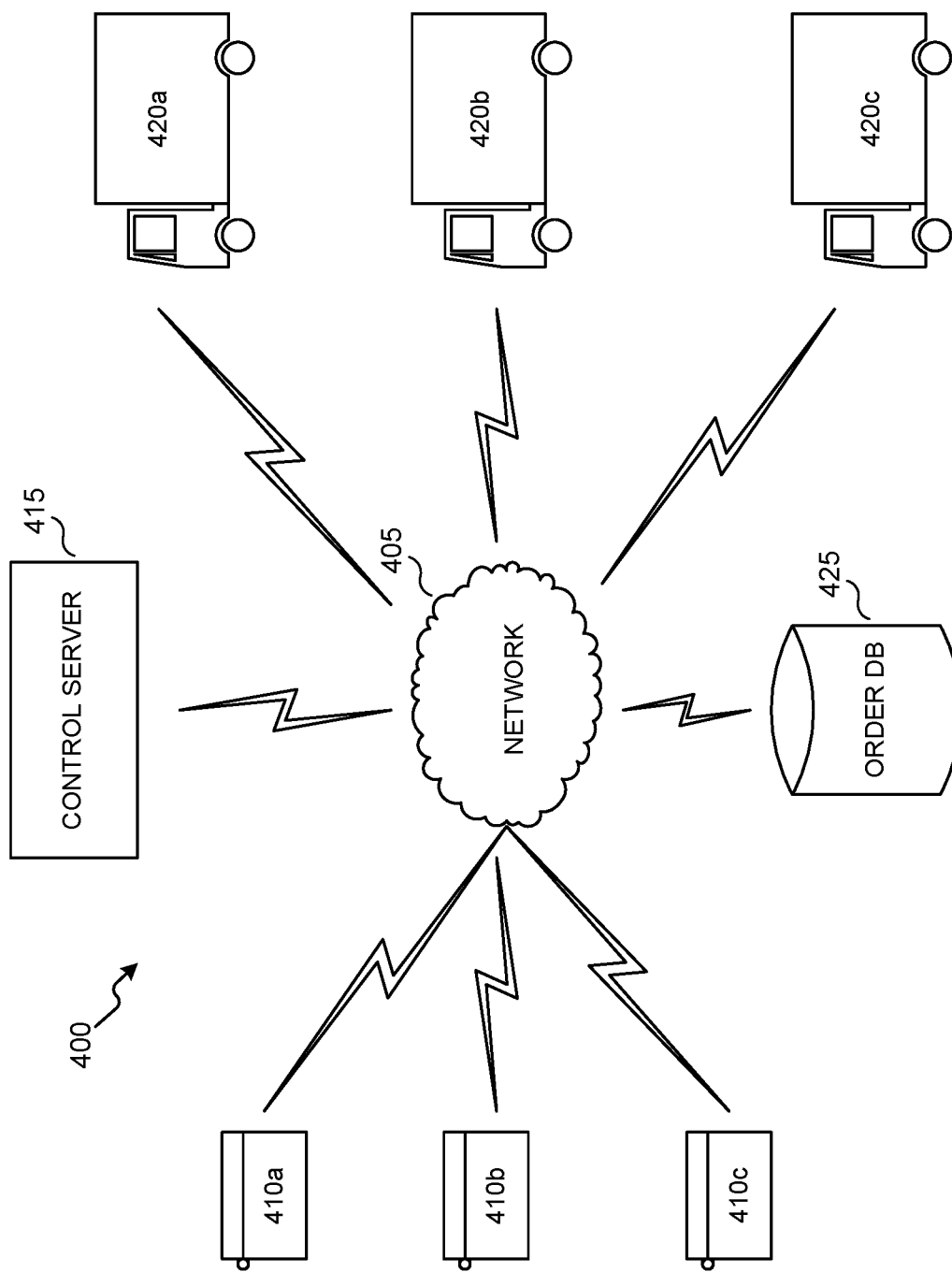
FIG. 4 illustrates an example of a network context according to embodiments of this disclosure.

FIG. 4 illustrates an example of network context 400 according to embodiments. Referring to FIG. 4, systems and methods for performing power management in a climate controlled smartbox according to embodiments operate as separate components linked by network(s) 405. In embodiments, network 405 may be the Internet, which can be accessed over both wired connections (such as at an Ethernet connection provided in, for example, a warehouse, a charging point for a smartbox, a staging location for a smartbox, or in a delivery vehicle) or over a wireless connection, such as a wireless local area network (WLAN) connection or a 3G network. In other embodiments, network 405 may be a combination of private networks (such as a local wireless mesh network) and public networks, such as a telephone (POTS) network. According to embodiments, network 405 may support multiple communication protocols, including both wireless protocols (for example, Bluetooth, circuit-switched cellular, 3G, LTE, or WiBro) and internet protocols (such as HTTP).

In embodiments, the one or more constituent networks of network 405 provide two-way connectivity between smartboxes 410a-410c and control server 415. Additionally, the one or more constituent networks of network 405 provide two-way connectivity between delivery vehicles 420a-420c. Further, depending on the scale of the implementation, network context 400 may, according to embodiments, include a networked order database 425. In embodiments, networked order database may be implemented as a SQL database on a SQL server connected to network 405. In other embodiments, networked order database 425 may be implemented using a cloud architecture, or as a columnar database.

In certain embodiments, actors within network context 400 may be able to communicate directly with one another (for example, through a sidelink). For example, each of delivery vehicles 420a-420c may be able to communicate with one another on a separate channel (such as the sidelink functionality provided by certain versions of the 3G or LTE wireless standards) or through network 405. Likewise, each of smartboxes 410a-410c may be able to communicate with each other and with each of delivery vehicles 420a-420c.

Figure 5:
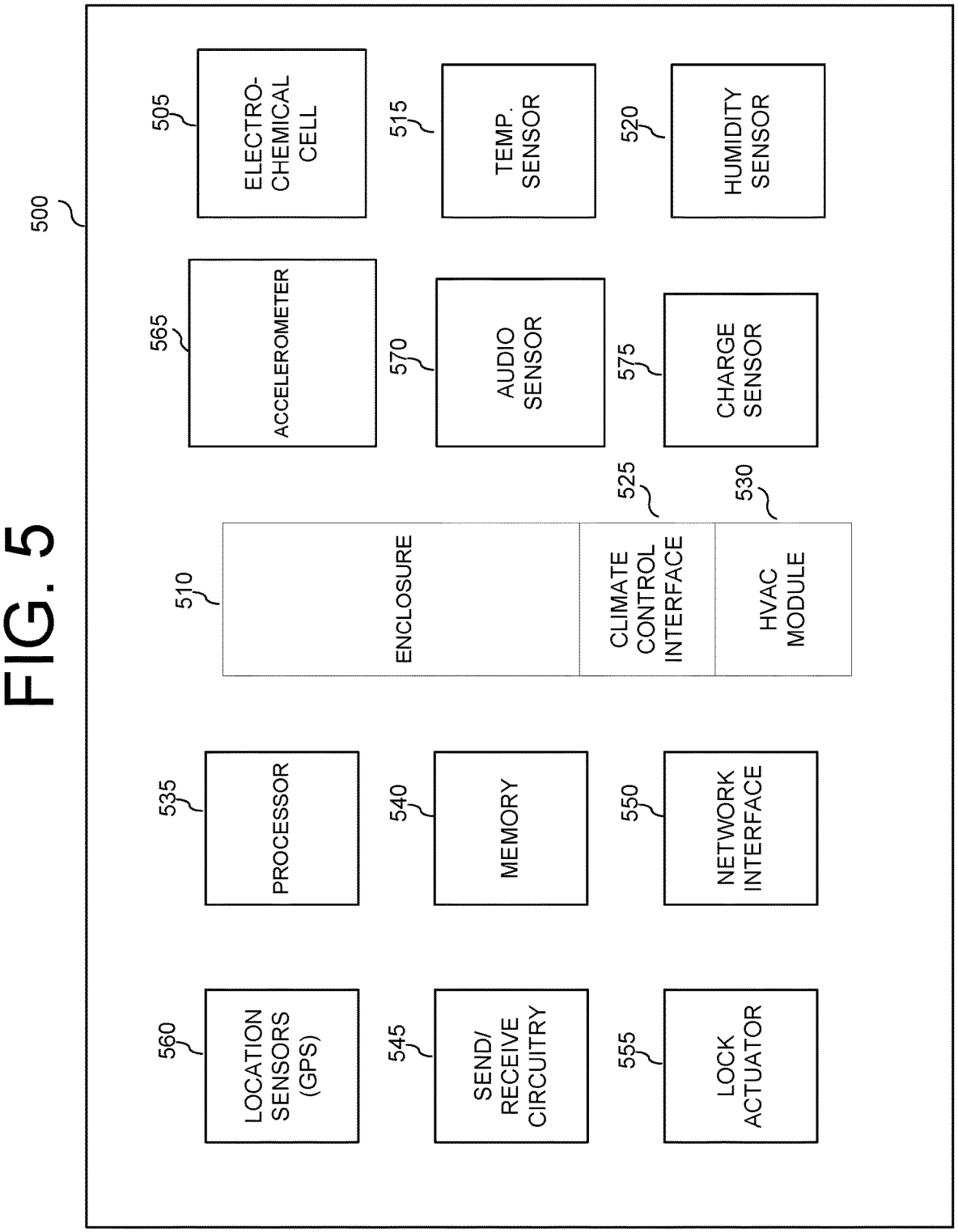
FIG. 5 illustrates an example of a climate controlled smartbox according to embodiments of this disclosure.

FIG. 5 illustrates, in block diagram format, an example of a climate controlled smartbox 500 according to embodiments. Referring to FIG. 5, smartbox 500 includes an electrochemical cell 505, which maintains a stored electric charge which is available for use by systems of the smartbox. According to embodiments, electrochemical cell 505 is a battery, such as a rechargeable lithium-ion battery. According to other embodiments, electrochemical cell 505 is a fuel cell. Electrochemical cell 505 powers components of the smartbox associated with maintaining a property (such as temperature or humidity) of a non-fluid medium contained within a resealable enclosure of smartbox 500, including temperature sensor 515, humidity sensor 520, climate control interface 525 and HVAC module 530. Additionally, electrochemical cell 505 powers components associated with the control logic and computational operations of the smartbox, including processor 535 and memory 540. Further, electrochemical cell 505 powers components of smartbox 500 associated with communications and network connectivity, including send/receive circuitry 545 and network interface 550. In embodiments, electrochemical cell 505 powers components associated with maintaining the security and integrity of the contents, including lock actuator 555.

According to embodiments, electrochemical cell 505 powers componentry associated with the generation of data useful for, inter alia, tracking the location of the smartbox, generating estimates as to delivery conditions, or generating or updating estimates of the utility window of the contents. Examples of such components include location sensors 560, accelerometer 565, audio sensor 570, and charge sensor 575.

While not shown in FIG. 5, smartbox 500, may in certain embodiments comprise power sources other than electrochemical cell 505. According to embodiments, smartbox 500 may further include one or more interfaces for charging electrochemical cell 505, such as connectors to standard 110 volt power outlets. Smartbox 500 may have one or more connections to other power interfaces, such as the proprietary charging cables used by certain electric vehicles, or charging equipment provided in a delivery vehicle (for example, delivery vehicle 105 shown in FIG. 1). In other embodiments, smartbox 500 may comprise components for generating electricity at the smartbox, including solar cells, wind turbines, or generators powered by one or more internal combustion engines.

In embodiments, efficient management of the charge held in electrochemical cell 505 poses a mission-critical technical problem to the successful operation of smartbox 500. As discussed above, smartbox 500 may be deployed in anticipation of future satisfaction of one or more conditions, such as an order for their contents or an order for their contents followed by a cooking or preparation operation. As such, the control logic of smartbox 505 must manage its use of power resources in a way that strikes an effective balance between the need to be "smart" (for example, by remaining networked and able to adjust its operation in response to current factors), while at the same time, ensuring its ability to maintain a parameter of a non-toxic medium in the storage enclosure (such as the air temperature of a refrigerated space), and if necessary, hold enough energy in reserve to perform a terminal operation (such as cooking or portioning contents) and signaling completion of its task.

According to embodiments, resealable storage enclosure 510 of smartbox 500 comprises a sealed, insulated enclosure (such as a refrigerator, cooler, or transport enclosure) suitable for holding a non-toxic fluid medium (for example, air, water, wine, beer, or nitrogen), and, in embodiments, contents in addition to the non-toxic fluid medium (for example, forensic evidence, blood samples, tissue samples, food, organs for donation, produce, or delicate laboratory samples). Resealable enclosure 510 is connected to a climate control interface 525 such that the non-toxic fluid medium may be circulated between resealable enclosure 510 and climate control interface 525, such as through vents in resealable enclosure 510. In embodiments, resealable enclosure 510 is connected to climate control interface 525 such that volumes of the non-toxic fluid medium in resealable enclosure 510 may be exchanged, such as through a vent provided by climate control interface 525.

According to embodiments, climate control interface 525 comprises a processor (for example, processor 535) controlled system for adjusting a property (for example, temperature, humidity, or particulate content) of the non-toxic medium in resealable enclosure 510. In embodiments, climate control interface 525 comprises a computer controlled flapper valve controlling the passage of air into and out of resealable enclosure 510. In such embodiments, climate control interface 525 may, in response to a control input from processor 535, open the valve to allow the passage of air in and out of resealable enclosure 510. In embodiments, opening the valve provided by climate control interface 525 may allow the scents of the contents of the resealable enclosure 510 to be vented to the outside world, which may serve as an advertisement for the contents of the resealable enclosure 510. In an example, venting under the control of processor 535 may be necessary to release buildups of particulate matter (for example, fishy smells, or in the case of apples, outgassed ethylene) in the non-toxic medium which may adversely affect the utility window of the contents of the resealable enclosure 510. In embodiments, opening climate control interface 525 may occur when the smartbox is "docked" at a point where volumes of climate controlled non-toxic medium can be provided, such as by a tube blowing hot or cold air into resealable enclosure 510. Climate control interface 525 can, according to embodiments, be a system of shutters or liquid crystals for regulating the intake of ultraviolet and infrared from the sun and environment in and out of the smartbox.

According to embodiments, climate control interface 525 may comprise or be communicatively connected to one or more HVAC modules 530. In embodiments, HVAC module 530 can be a refrigerator operating under power provided by electrochemical cell 505. In other embodiments, HVAC module 530 can be a heater operating under power provided by electrochemical cell 505, the output of which is sufficient to maintain the contents of resealable enclosure 510 at a serving temperature. In other embodiments, HVAC module 530 includes a heater having thermal output sufficient to cook (for example, by slow cooking, sous-vide, braising, baking, or searing) the contents of resealable enclosure 510. According to embodiments, HVAC module 530 includes a solar oven operating under the control of processor 535. According to embodiments, processor 535 is a "lightweight"

or energy efficient processor, such as a Samsung Exynos i or an ARM Cortex-M23. Processor 535 provides sufficient processing power to execute instructions stored in memory 540 for controlling the operation of each of temperature sensor 515, humidity sensor 520, climate control interface 525, HVAC module 530, Send/receive circuitry 545, network interface 550, lock actuator 555, location sensors 560, accelerometer 565, audio sensor 570, and charge sensor 575.

According to embodiments, memory 540 comprises a non-transitory memory, such as a solid state hard drive or an embedded Flash (eFlash) memory, suitable for storing program code. Memory 540 may further comprise some combination of volatile and non-volatile memory (for example, low power DDR memory) and an interface for an external flash memory. According to embodiments, send/receive circuitry 545 can receive an incoming RF signal, for example, a near field communication signal such as a BLUETOOTH or WI-FI signal. Send/receive circuitry 545 can down-convert the incoming RF signal to generate an intermediate frequency (IF) or baseband signal. The IF or baseband signal is sent to processing circuitry included within send/receive circuitry 545, which generates a processed baseband signal by filtering, decoding, or digitizing the IF or baseband signal. The processing circuitry transmits the processed baseband signal to the processor 535 for further processing (such as analyzing contextual data or updating rules relating to the handling of contents within resealable enclosure 510).

Send/receive circuitry 545, can in a transmission mode, receive outgoing baseband data (such as web data, status information) from the processor 535. Send/receive circuitry 545 encodes, multiplexes, or digitizes the outgoing baseband data to generate a processed IF or baseband signal. Further, the send/receive circuitry 545 up-converts the IF or baseband signal to an RF signal for transmission.

According to embodiments, network interface 550 operates to interconnect smartbox 500 with one or more networks (for example, network 405 in FIG. 4). Network interface 550 may, depending on embodiments, have a network address expressed as a node ID, a port number, or an IP address. According to embodiments, network interface 550 is implemented as hardware, such as by a network interface card (NIC). In an example, network interface 550 may be implemented as software, such as by an instance of the java.net.NetworkInterface class. According to embodiments, network interface 550 supports communications over multiple protocols, such as TCP/IP as well as wireless protocols, such as 3G or Bluetooth.

According to embodiments (for example, smartbox 600 shown in FIG. 6), a smartbox includes one or more locks (for example, locks 605a and 605b shown in FIG. 6) operating under control of processor 535. In the example of FIG. 5, the one or more locks under the control of processor 535 are locked and unlocked by actuator(s) 555. According to embodiments, actuator(s) 555 may be relays, or door lock actuators known in the art, such as the "poppers" used for processor-managed control of vehicle and building door locks.

In embodiments, smartbox 500 includes one or more sensors configured to operate in conjunction with and/or to detect audio or electromagnetic energy. The sensor(s) may include one or more of a video, IR, radar, or Xray capability and/or include location sensor(s) 560. Location sensor(s) 560 can include global positioning sensors (e.g., sensors for use with GPS systems, Beidou systems, or GNSS systems). In an example, location sensor(s) 560 can comprise sensors for determining location based on network connectivity services, for example, positioning services provided by 3G communications systems or positing services based on detection and identification of available wireless networks (for example, Wi-Fi networks). Numerous variations are possible and within the intended scope of this disclosure. According to embodiments, smartbox 500 comprises one or more orientation or movement sensors such as accelerometer(s) 565, gyroscope(s), tilt sensor(s), etc. In the example of FIG. 5, accelerometer 565 is a triple-axis inertial measurement unit (IMU) type accelerometer. According to embodiments, the orientation or movement sensor(s) may be configured to record when the acceleration of smartbox 500 exceeds a predetermined threshold value, as such values may correlate to smartbox 500 being dropped or otherwise handled in a way that is adverse to one or more contents of resealable enclosure 510 (for example, if eggs or other delicate foodstuffs are being transported in resealable enclosure 510). The orientation or movement sensor(s) may alternatively or additionally be used for positioning and location functions and/or to detect failure or pre-failure vibrations of other components associated with a contents delivery system (e.g., robotics carrying the smartbox) or of a delivery vehicle (e.g., AV) carried by the delivery system.

According to embodiments, smartbox 500 comprises an audio sensor 570. In the example of FIG. 5, audio sensor 570 is a microphone on the exterior of the smartbox that receives voice prints, which can, in embodiments, be authenticated by processor 535. In response to authenticating a voice print received at audio sensor 570, processor 535 may provide a control input to lock actuator 555 to release the lock on resealable enclosure 510. In other embodiments, audio sensor 570 may, like accelerometer 565, be configured to record instances in which a sound level exceeds a predetermined threshold value corresponding to an undesired handling condition (e.g., being in too loud or too crowded of a transit environment) for one or more contents of resealable enclosure 510.

Charge sensor 575, is according to embodiments, a battery sensor containing a shunt circuit for sensing currents and charges produced by electrochemical cell 505. According to embodiments, charge sensor 575 can account for temperature variations on the measured charge. Charge sensor 575 may output its charge measurements to processor 535 using any suitable communication protocol, including Local Interconnect Network (LIN) protocol.

In embodiments, smartbox 500 includes one or more condition sensors such as temperature sensor(s) 515 to provide condition (e.g., temperature) data for regions of interest, including resealable enclosure 510 to processor 535. According to embodiments, temperature sensor 515 is a thermistor connected to an analog-to-digital converter, which in turn is connected to a bus (not shown) connected to processor 535. In embodiments, smartbox 500 may include a condition sensor such as a digital humidity sensor 520, which is connected, via a bus to processor 535, to provide humidity data for a region of interest to processor 535, including resealable enclosure 510. Smartbox 500 may additionally or alternatively include condition sensor(s) such as pH, $CO_2$, $CH_4$ or other sensor(s) to measure the condition of a region of interest such as a portion food.

Figure 6:
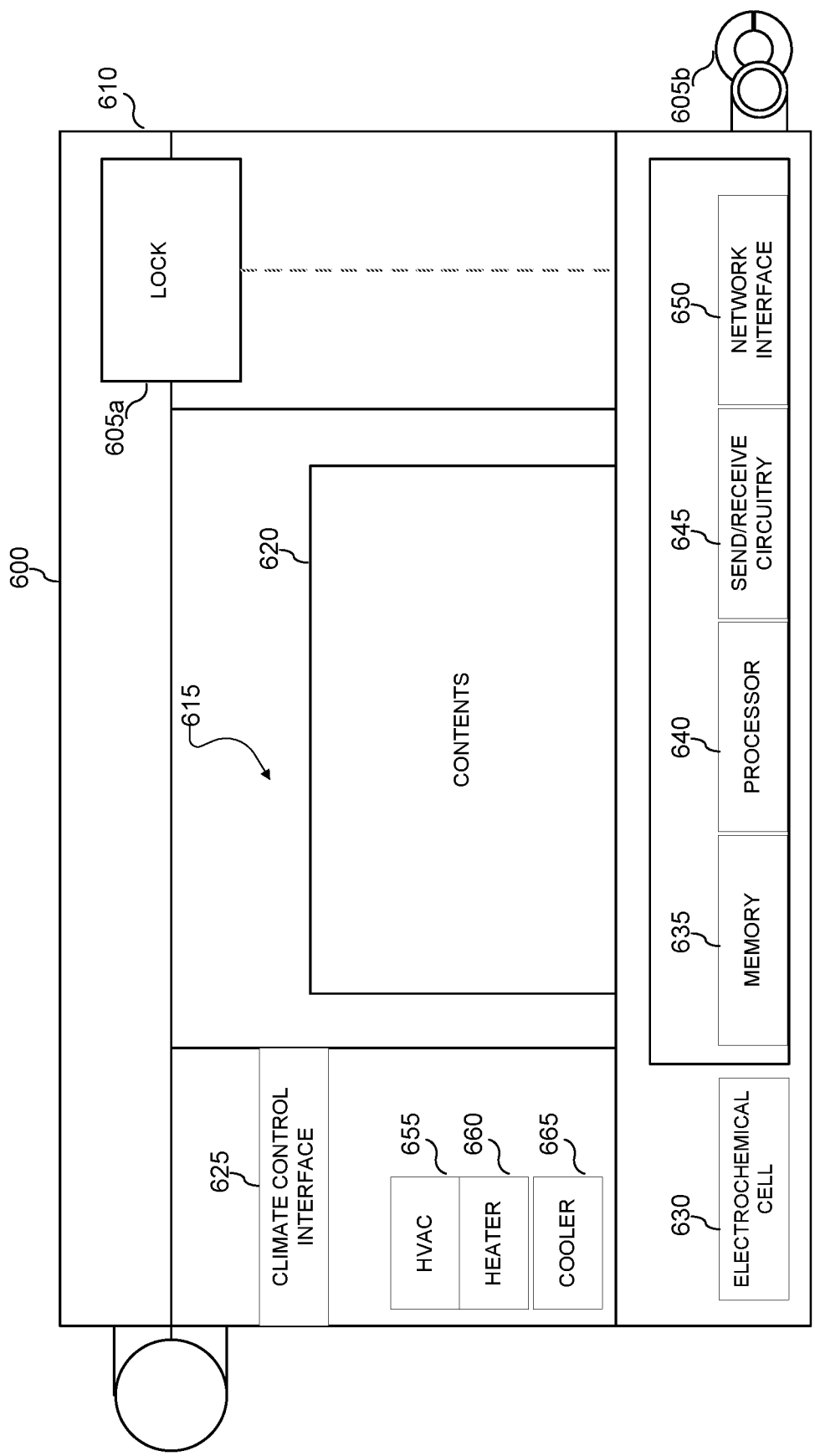
FIG. 6 illustrates another example of a climate controlled smartbox according to embodiments of this disclosure.

FIG. 6 illustrates a further example of a climate controlled smartbox 600 according to embodiments. With reference to the example of FIG. 6, smartbox 600 employs a box-type architecture comprising a rigid, insulated six-sided box (e.g., having six interior walls) which includes a hinged, locking lid 610. Other architectures, including cylindrical shapes or rigid bases to which a resealable membrane is attached, are possible and within the intended scope of this disclosure. In this particular example, the smartbox defines a resealable storage enclosure 615 containing a non-toxic fluid medium and capable of holding contents 620. According to embodiments, contents 620 can be perishable, raw, frozen or at a temperature suitable for serving or maintaining food safety. Additionally, to maximize spatial efficiency, one or more of the operating components of smartbox 600, such as the climate control interface 625, electrochemical cell 630, memory 635, processor 640, send/receive circuitry 645, and network interface 650, may grouped together or combined in or on wall surfaces of smartbox 600. Depending on embodiments, the exterior of smartbox 600 may also contain solar cells, for powering the smartbox, or metal structures of the exterior may, to optimize the use of the available physical space, function as antennas for the send/receive circuitry 645.

According to embodiments, smartbox 600 includes interior locks 605a and exterior locks 605b. In the example of FIG. 6, interior locks 605a are opened and closed by a lock actuator (for example, lock actuator 555 shown in FIG. 5) under the control of processor 640, and restrict operation of lid 610, and by implication, access to resealable storage enclosure 615 and contents 620. In embodiments, exterior locks 605b are likewise opened and closed by a lock actuator (for example, lock actuator 555) under the control of processor 640. Exterior locks can in cases operate to secure smartbox 600 to a trusted structure, such as a delivery vehicle (for example, delivery vehicles 105 and 120 shown in FIG. 1), a staging location (such as staging location 110) shown in FIG. 1, locking infrastructure(s) (such as described in FIG. 3), or another smartbox. In modified embodiments, a single locking mechanism (e.g., controllable by lock actuator 555) may be configured to lock and/or unlock the lid 610 and to fasten and/or unfasten smartbox 600 to an anchor or staging point.

According to embodiments, climate control interface 625 is disposed in a wall of smartbox 600 and can allow air to be exchanged between resealable storage enclosure 615 and the outside world. Additionally, other modules which can be included as part of climate control interface 625 for effecting changes of one or more properties of a non-toxic fluid medium in resealable storage enclosure 615, may be disposed in one or more of the walls (e.g., sidewalls) of smartbox 600. For example, an HVAC module 655 (or, for example, HVAC module 530 shown in FIG. 5) can be provided within one or more of the walls of smartbox 600. Additionally, a heater or cooker 660 or a separate cooler 665 may be provided within one or more of the walls (e.g., sidewalls) of smartbox 600.

In embodiments, one or more electrochemical cells 630 are contained within the space between the walls of resealable storage enclosure 615 and the exterior of smartbox 600. In embodiments, electrochemical cell 630 may be disposed in the bottom of smartbox 600 to improve balance of smartbox 600, as certain electrochemical cells, such as batteries, may be denser than the surrounding components of smartbox 600. In other embodiments, electrochemical cell 630 may be disposed in lid 610 to facilitate replacement or access for repair.

FIG. 7 illustrates, in block diagram format, a control server 700 according to embodiments. In the example of FIG. 7, control server 700 is a management server, such as a Dell® PowerEdge server embodied on a single server rack. According to embodiments, control server 700 includes program code (for example, stored in a memory 715), which when executed by one or more cores of a processor 705, causes control server 700 to communicate through network interface 710 with one or more smartboxes (for example, smartbox 600 shown in FIG. 6). Although control server 700 is described with reference to a single server machine, multiple architectures for implementing control server 700 are possible and within the scope of this disclosure. According to embodiments, control server 700 may comprise multiple physical servers.

In embodiments, processor 705 is a central processing unit (CPU) chip provided within a server. According to other embodiments, control server 700 may be implemented across multiple servers or as part of a cloud computing system. In such embodiments, processor 705 consists of multiple separate processors operating across a dynamically changeable cast of server machines. According to still other embodiments, control server 700 may be implemented on a virtual machine, wherein processor 705 is a virtual CPU consisting of an assignment of processor resources of the physical machine(s) implementing the virtual machine. Numerous embodiments are possible and within the intended scope of this disclosure.

According to embodiments, network interface 710 operates to interconnect control server 700 with one or more networks (for example, network 405 in FIG. 4). Network interface 710 may, depending on embodiments, have a network address expressed as a node ID, a port number, or an IP address. According to embodiments, network interface 710 is implemented as hardware, such as by a network interface card (NIC). In an example, network interface 710 may be implemented as software, such as by an instance of the java.net.NetworkInterface class. According to embodiments, network interface 710 supports communications over multiple protocols, such as TCP/IP as well as wireless protocols, such as 3G or Bluetooth.

Execution of the program code by processor 705 may cause control server 700 to receive from a climate controlled smartbox, via a network, a time stamped value of a measured parameter of the smartbox, determine a time stamped estimate of the remaining charge in an electrochemical cell of the smartbox, determine a time stamped operating parameter of the smartbox based on the time stamped value of the measured parameter and the time stamped estimate of the remaining charge in the electrochemical cell, and transmit, via the network, the determined operating parameter.

According to embodiments, control server 700 includes a mobile application interface 720, which operates in conjunction with network interface 710 to, for example, receive orders for operations (for example, workflow 200 shown in FIG. 2) to be performed using a smartbox connected through network interface 710 to control server 700. Depending on embodiments, mobile application interface 720 may be configured to receive inputs directly from an application executing on a mobile device (such as a phone, or in other embodiments, a smartbox). In embodiments, mobile application interface 720 also receives control inputs (for example, orders, updates to orders, and user-specified changes in operating parameters, such as a delivery time) via a web site.

In embodiments, control server 700 comprises rules engine 725. Rules engine 725 operates as a repository and generator of rules associating conditions with operating parameters for the smartbox and/or other delivery system resources such as delivery AV(s). According to embodiments, rules maintained in rules engine 725 may be user-defined. For example, in the case of a family with an order for smartbox-delivered ingredients for "taco night," discussed above, rules engine 700 may contain a user-specified conditional rule indicating that, if the day coincides with, for example, a particular event (for example, a televised baseball playoff game), additional items, such as cold beverages and chips, should be included in the order.

According to other embodiments, rules engine 725 receives aggregated data, such as through a database service or through a web scraping (e.g., of or associated with social media and/or a diverse set of non-structured media data) functionality application executing on control server 700, and determines or updates conditional rules correlating events in the aggregated data with operating parameters for a smartbox and/or other delivery system resource(s) such as delivery AV(s). In one illustrative example, control server 700 may, through the use of machine learning techniques, determine a correlation between particular items in the system's order history (for example, orders for soup) and aggregated data of exogenous factors, such as pollen count or evidence of flu outbreaks (e.g., headlines in news sites or web publications or incidence of advertisements encouraging people to get influenza shots). In embodiments, machine learning techniques implemented by rules engine 725 include regression algorithms, clustering algorithms, and classification algorithms. In other embodiments, rules engine 725 may implement a neural network or random forest algorithm to establish correlations between operating parameters and aggregated data received at rules engine 725. Rules engine 725 may facilitate an optimization level associated with delivery resources or relocation logistics of resources from other parts of a region and/or may enable optimization across a higher level for delivery resources such as delivery AVs, preplacement of AVs, what to stock in smartboxes, and/or where to stock items associated with smartboxes.

Figure 8:
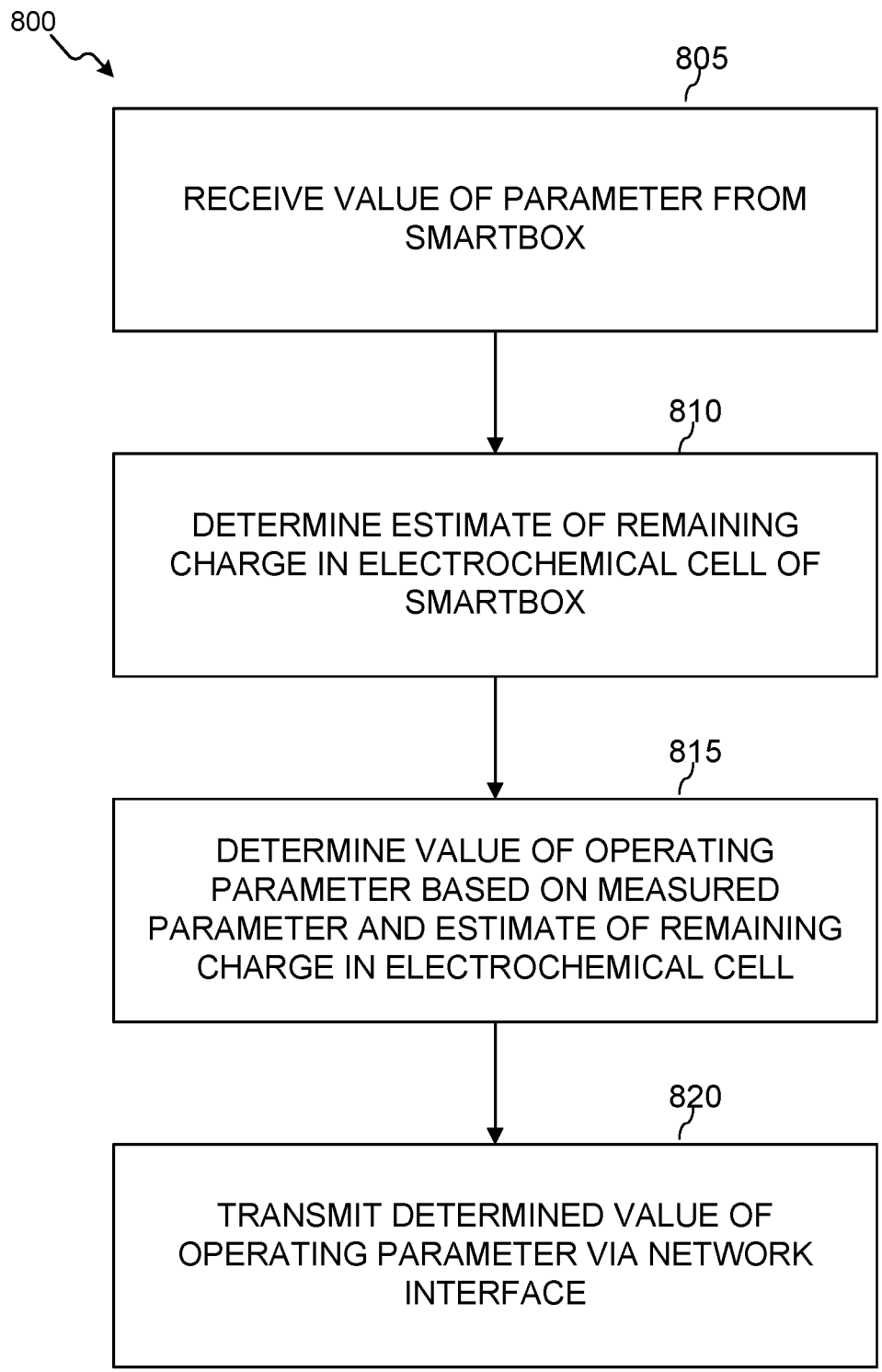
FIG. 8 illustrates operations performed by a control server in a method for power management in a climate controlled smartbox according to embodiments of this disclosure.

FIG. 8 illustrates operations performed by a control server in a method 800 for power management in a climate controlled smartbox according to embodiments. Method 800 may performed at a control server (for example, control server 415 shown in FIG. 4 or control server 700 in FIG. 7) or on an application executing on a mobile terminal or other computing platform. According to embodiments in which, for example, a smartbox (for example, smartbox 100*a* shown in FIG. 1) is deployed for a long duration or under conditions in which power usage is mission-critical (including where the smartbox may be making heavy use of power resources for signaling, positioning, or satisfying a terminal condition (such as by heating a dish)), method 800 begins with operation 805. In operation 805, the control server receives a value of a parameter from the smartbox. According to embodiments, the parameter may be received by the control server via a network, such as network 405 shown in FIG. 4. In other embodiments, the parameter may be received directly from the smartbox, for example, via a data cable, radio signal (including a Bluetooth or 3G signal), or via an optical link.

In embodiments, the parameter received by the control server at operation 805 may be a measured parameter of the smartbox, including a value of a charge stored in an electrochemical cell of the smartbox, a value or code corresponding to a state of network connectivity (for example, an indication as to which wireless or wired network connections are available to the smartbox), or a value corresponding to a condition of the non-toxic fluid medium stored in the resealable enclosure. According to embodiments, the parameter received by the control server is measured at the smartbox (for example, a coordinate value corresponding to the smartbox's location measured using a GPS sensor, an acceleration value exceeding a specified threshold, a value of a temperature measured inside a resealable enclosure of the smartbox, a value of a temperature measured outside the smartbox, a value of a light intensity (e.g., radiant energy from the sun on the exterior of the smartbox), a value of a content in the smartbox, or a value corresponding to control input received at the smartbox (for example, a command to release one or more locks of the smartbox)).

In embodiments, in addition to the parameter received from the smartbox, the control server may, at operation 805 also receive a parameter from another source, including an order database server (for example, order database 425 in FIG. 4), a staging location (for example, staging location 110 in FIG. 1), or a delivery vehicle (for example, delivery vehicle 105 in FIG. 1 or delivery vehicles 420*a*-420*c* in FIG. 4). Such parameters include location information, anchor status information, and whether an intended recipient of the contents has been contacted. According to other embodiments, as part of operation 805, the control server receives a parameter set based the application of predetermined rules to aggregated data, such as by the operation of a rules engine (for example, rules engine 725 in FIG. 7). In embodiments, the value of the parameter received by the control server at 805 is time stamped at the time of generation at the smartbox. In an example, the value of the parameter may be time stamped by the control server at the time of arrival. In other embodiments, the value of the parameter is not time stamped but carries other indicia of recency. For example, upon receipt of a new value of the parameter, a memory of the control server automatically flushes the old value and replaces it with the newly received value.

According to embodiments, method 800 comprises operation 810, wherein the control server determines an estimate of the charge remaining in the smartbox. In embodiments, the estimate of the charge is determined based on the application of one or more predetermined rules to a value of a parameter received at operation 805. As discussed above, in embodiments, effective management of the charge stored in the electrochemical cell(s) is mission-critical to the intended operation of the smartbox (for example, when delivering temperature-dependent contents, such as food or organs for donation), and the operating parameters provided from the control server to the smartbox must be consistent with maintaining a requisite level of charge at the electrochemical cell for the duration of the smartbox's mission.

At operation 810, the control server may estimate the remaining charge in the electrochemical cell of the smartbox as a single time stamped value. In other embodiments, the control server's estimation of the charge in the smartbox may be expressed as parameters of a time based decay curve. In other embodiments, the control server's estimate of the charge in the smartbox may be expressed as parameters of a probabilistic model of the charge in the electrochemical cell over a specified time interval. According to still other embodiments, the estimate of remaining charge in an electrochemical cell is expressed as an estimate of when the charge in the electrochemical cell will run out or fall below a threshold value. For example, the threshold value may indicate a battery run time or a battery life, either of which may correspond to how long the smartbox can maintain a preferred or acceptable container environment. Numerous embodiments are possible and within the intended scope of this disclosure.

According to embodiments, method 800 further comprises operation 815, wherein the control server determines the value of an operating parameter for the smartbox. Specifically, in embodiments, the control server determines the value of the operating parameter based at least in part on the estimate of the remaining charge in the electrochemical cell generated at operation 810. According to embodiments, as discussed further herein, at operation 815, the control server may determine the operating parameter based on a combination of the estimated remaining charge in the electrochemical cell and a further parameter.

As used in this disclosure, operating parameters for the smartbox include set values of parameters to be achieved by one or more components of the smartbox (for example, a temperature to be achieved or maintained within a resealable storage enclosure, or a state of a component, such as a processor lock of the smartbox). In an example, operating parameters include pacing information regarding processes performed by a processor or other component of the smartbox (for example, a timing interval controlling how frequently the smartbox utilizes a GPS module to determine its physical location). Operating parameters for the smartbox include rules or updates for rules controlling the operation of one or more components of the smartbox (for example, the wireless connectivity fallback logic 1100). Still further, operating parameters for the smartbox include information regarding an order or updates to an order for the contents of a resealable storage container of the smartbox.

According to embodiments, method 800 further comprises operation 820. At operation 820, the control server and/or control logic (for example, delivery system enterprise application suite 210 in FIG. 2) transmits the determined operating parameter (e.g., to the smartbox). In the example of FIG. 8, the control server transmits the determined operating parameter through a network interface (for example, network interface 710 in FIG. 7) to the smartbox via a network, such as network 405 in FIG. 4.

Embodiments of method 800 may be understood with reference to the following example. According to embodiments, a smartbox under the control of a given control server comprises the components shown in the illustrative smartbox 500 shown in FIG. 5, and additional components, including one or more robotic arms and an electronic scale. In this particular example, the smartbox is attached via an external lock to a small autonomous vehicle, such as drone 120 shown in FIG. 1, and the payload of its resealable storage enclosure includes recipe ingredients which are to be delivered to a customer placing an order through the control server. In this example, the smartbox is dispatched via the autonomous vehicle to a staging area proximate to a location where the control server expects an order for delivery to be placed. In this example, after the smartbox has been dispatched to the staging area, it sends values of multiple parameters to the smartbox, including its location, external temperature data and a time stamped indication of the charge of the electrochemical cell in the smartbox to the control server.

Subsequently, the control server applies one or more predetermined rules to determine a probabilistic profile of the charge in the smartbox based on the time stamped value of the charge in the smartbox, the air temperature at the staging area, and its own knowledge relating to the contents. In an example, the knowledge may indicate that the contents include fresh eggs, which must be stored at a temperature of 45 degrees Fahrenheit. To maximize the charge in the electrochemical cell, the control server applies the received values from the smartbox, along with data local to the smartbox regarding the contents of the storage enclosure and storage requirements for same, to rules generated by a rules engine of the control server. In this case, the value of the external temperature at the staging area recorded by the smartbox is 43 degrees Fahrenheit, which, according to the predetermined rules, is sufficiently close to the recommended temperature for storing raw eggs that it is appropriate for the smartbox to open a vent of a climate control interface to allow the temperature within a resealable storage enclosure of the smartbox to be maintained with outside air. Accordingly, the control server generates an operating parameter corresponding to an "open" state of a vent valve of the climate control interface and transmits same, via a 3G wireless connection, to the smartbox. In another example, the knowledge may indicate that the contents needs to be maintained at a relatively high temperature, within some tolerance. Here, if the outside temperature is particularly low, the control server may direct (e.g., signal) the smartbox (e.g., the climate control interface) to raise the temperature to an upper bound (e.g., a specified highest temperature) value associated with the tolerance while external power is available (e.g., while the smartbox is on a transport vehicle that can provide power). After the smartbox begins to run on battery, it may maintain the contents above or at a lower bound (e.g., a specified lowest temperature) value (associated with the tolerance) to conserve battery power. According to an aspect, the smartbox may, based on the knowledge, be dispatched to a staging area having a favorable temperature and/or having a power outlet.

Figure 9:
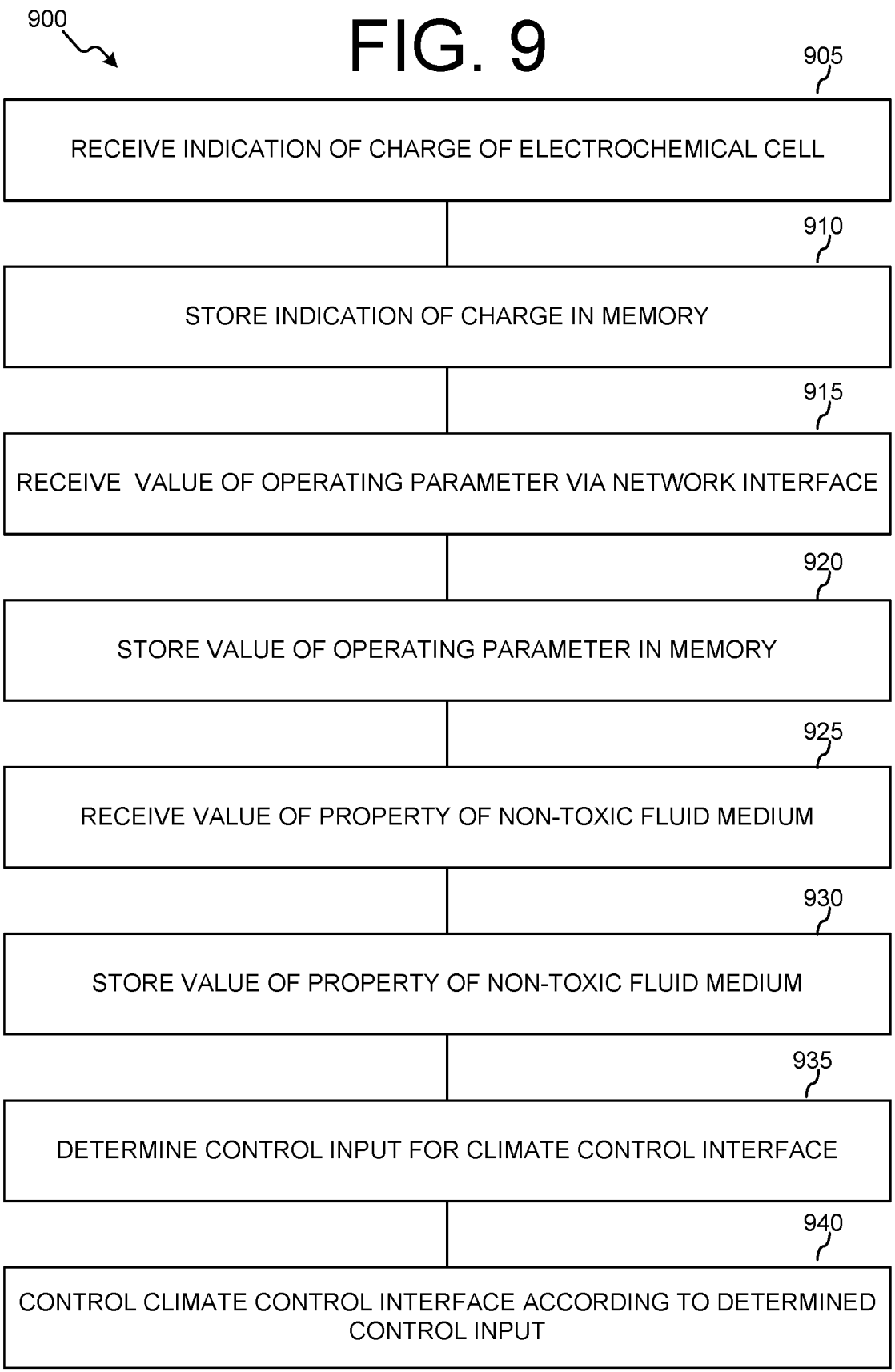
FIG. 9 illustrates operations of a method for power management in a climate controlled smartbox according to embodiments of this disclosure.

FIG. 9 illustrates operations of a method 900 for power management in a climate controlled smartbox according to embodiments. According to embodiments, method 900 comprises operation 905, at which a processor of the smartbox receives an indication of a value of a charge remaining in an electrochemical cell of the smartbox. The indication of the remaining charge of the electrochemical cell is, in embodiments, received via a charge sensor connected via a bus to the processor. In other embodiments, the indication of remaining charge may be received from an actor or entity external to the smartbox, including a control server (such as control server 415 in FIG. 4). In embodiments according to this disclosure, the indication of the remaining charge in the electrochemical cell is stored in memory at operation 910. Further, the indication of the remaining charge may be time stamped, so as to reduce a number of future temperature measurement and processing operations, thereby reducing use of stored electrochemical charge by the processor.

In the example of FIG. 9, at operation 915, the processor receives, via a network interface (for example, network interface 550 in FIG. 5), a value of an operating parameter. According to embodiments, the value of the operating parameter is received, via a network, from a control server. According to other embodiments, the operating parameter is received from a mobile terminal running an application for controlling one or more parameters (for example, parameters relating to an order for one or more contents stored in a resealable storage enclosure of the smartbox). In embodiments, the value of the operating parameter may be time stamped or carrying other indicia of recency, and the smartbox will generate control inputs based in part on the recency of the operating parameter. For example, a control input specifying a temperature to be attained by a non-toxic fluid medium in the storage enclosure, may, when recent, translate into more control inputs pertaining to heating or cooling operations of the climate control interface to account for hysteresis effects while trying to achieve the desired temperature. However, after a predetermined period, the processor may generate fewer control inputs, on the expectation that the specified temperature has been maintained. Accordingly, certain embodiments are able to conserve the charge stored in the electrochemical cell. Similarly, certain embodiments may create fewer control inputs when a received operating parameter is recent (such as a request for a GPS location) and more control inputs when the operating parameter is older (such as when a location of the smartbox no longer corresponds to a specified route). Numerous embodiments are possible and within the intended scope of this disclosure. In embodiments, the operating parameter received at operation 915 is stored in a memory of the smartbox at operation 920. By storing the operating parameter in a memory, the smartbox may be able to further conserve the charge at the electrochemical cell by going into an "offline" state and relying on stored instructions, rather than maintaining its wireless communication systems in an active state.

According to embodiments, method 900 also comprises operation 925. At operation 925, the processor receives the value of a property of the non-toxic fluid medium in the storage enclosure. In the example of FIG. 9, the value of the property of the non-toxic fluid medium is at least one of a measured property of the non-toxic fluid medium (for example, temperature, humidity, or turbidity), a determined property of the non-toxic fluid medium (a cooling or heating rate), or a combination thereof. In cases, the value of the measured property of the non-toxic fluid medium may be taken by a measurement performed by one or more sensors provided by the smartbox, such as a digital thermometer connected to the processor via a bus. Depending on embodiments, the value of the property received at the processor at operation 925 may be time stamped or bearing other indicia of recency. According to embodiments, at operation 930, a processor of the smartbox stores the value of the property of the non-toxic medium received at operation 925 in a memory of the smartbox.

In the example of FIG. 9, at operation 935, the processor determines, through the application of one or more predetermined rules to at least one of the indication of charge in the electrochemical cell, the received operating parameter and the value of a property of a non-toxic medium a control input for implementing the operating parameter at one or more components of the smartbox. According to embodiments, the processor determines a control input for a climate control interface of the smartbox. The determination of a control input for a climate control interface of the smartbox is, in cases, a ratification or modification of a control parameter for the climate control interface provided by the control server. Returning to the example of a smartbox delivering eggs as part of a selection of recipe ingredients to be assembled and provided to a customer provided in the discussion of FIG. 8, if the smartbox receives from the control server, an operating parameter indicating that, a vent of the climate control interface should be opened to achieve an internal temperature of about 45 degrees Fahrenheit, the smartbox can simply ratify the operating parameter provided by the control server as a control input for the climate control interface. In an example, if the smartbox is unable to open the vent, due to damage or obstruction, the smartbox can, as part of operation 935, instead issue a control input to an HVAC module of the smartbox to set the temperature of the resealable storage enclosure to 45 degrees Fahrenheit. Accordingly, the intelligence of the system is split between the smartbox and the control server in a way that allows the control server to handle large, computationally expensive (and by implication, power hungry) data operations, and at the same time keeps the smartbox from having to continuously signal to control server to receive operating commands, thereby saving the charge of the electrochemical cell by avoiding unnecessary use of the send and receive circuitry.

Further, at operation 940, the processor transmits the determined control input to the appropriate componentry of the smartbox. According to embodiments, this transmission of control input(s) may be provided via a bus linking the processor to the components under control. In the example of FIG. 9, the control input is provided to the climate control interface.

FIG. 10 illustrates data structures for power management in a climate controlled smartbox according to embodiments. Effective power management for climate control in a smartbox can be achieved through the application of predetermined rules to values of parameters in at least two processing sites—the smartbox and a control server. Computationally expensive (and by implication, power-hungry) operations can be performed at the control server, thereby keeping the smartbox from unnecessarily draining the charge of an electrochemical cell through processing operations. The smartbox is able to apply predetermined rules to locally collected data, enabling the smartbox to operate offline, and without having to repeatedly communicate with, for example, an external control server, conserving the charge of the electrochemical cell by avoiding undue use of the send and receive circuitry. According to embodiments, two example data structures 1000 and 1050 are maintained at both the smartbox and the control server (collectively, "the system") to store values of parameters for power management. Data structures 1000 and 1050 may be lists, strings, tables, or dictionaries.

In the example of FIG. 10, one or more data structures 1000 provide values of parameters related to an order for contents to be transported in the resealable enclosure of the smartbox. Parameters for which values are maintained in data structure 1000 include status parameters 1005. According to embodiments, status parameters 1005 include "order received," "order delivered," "order modified," "order cancelled," and "order delayed." Data structure 1000 may include values for parameters 1010 pertaining to a location associated with an order, such as GPS coordinates for a delivery location or staging point or a street address corresponding to the order. Data structure 1000 may include values for parameters 1015 associated with the security requirements of the order, such as anti-theft measures to be taken, monitoring requirements, authentication requirements, maintenance of chain-of-custody data, and where appropriate, regulatory requirements (such as prohibited routes for the contents). Data structure 1000 may maintain, e.g., as order data 1020, values of parameters including or corresponding to the size of the order (e.g., weight of the contents to be placed in the resealable storage enclosure), an acceptable temperature range, shock/vibration sensitivity information, and/or an acceptable time before consumption.

In the example of FIG. 10, one or more data structures 1050 contain values of parameters specific to the resealable storage container or smartbox. In embodiments, data structure 1050 contains values of parameters 1055 relating to the status, for example, of the resealable storage container, parameters 1060 relating to a current location of the smartbox, and parameters 1065 relating to current or available capabilities of the smartbox (e.g., including battery status and/or sensor readings). According to embodiments, parameters 1065 relating to the capabilities of the smartbox include a number of attachment points associated with (e.g., on) the smartbox, locking capabilities of the smartbox, and what radio network resources are available for the smartbox to communicate over. According to embodiments, data structure 1050 includes parameters 1070 regarding security features available at the resealable storage container or smartbox. The foregoing data structures are merely illustrative of data structures which can be used in systems and methods for power management in a climate controlled smartbox. Additional or other data structures, including for example, data structures pertaining to rules to be updated and applied at the smartbox or control server, and data structures pertaining to current conditions in the delivery space (for example, traffic, weather, etc.) are possible and within the contemplated scope of this disclosure.

FIG. 11 illustrates fallback logic 1100 for signaling between a smartbox and a control server according to embodiments. The logic depicted may be provided by the control server to the smartbox as an operating parameter for the smartbox, preloaded at the smartbox, or determined at the smartbox using a machine learning technique. According to embodiments, a network interface of the smartbox (for example, network interface 550 in FIG. 5) provides the smartbox with multiple connectivity options for communicating with other entities in a network context (for example, network context 400 in FIG. 4). Each of these options provides different levels of data throughput/range and cost and places different demands for charge stored in an electrochemical cell of the smartbox. For example, Bluetooth provides modest data throughput with low energy requirements, but has very limited range. Similarly, circuit switched wireless (e.g., cellular) offers low data throughput and uses considerably less energy than, for example, 3G wireless, which provides modest data throughput but uses significantly more energy to support high frequency signaling and switching.

In the example of FIG. 11, fallback logic 1100 enables the smartbox to choose an optimal (for purposes of the smartbox's operation) connectivity option from among multiple possible connectivity options (e.g., five possible connectivity options 1105-1125). According to fallback logic 1100, the optimal and first connectivity option, if available, is for the smartbox to communicate through a wired network, as this offers good data throughput and low energy. If a wired network 1105 is not available, fallback logic 1100 instructs the smartbox to "fall back" and try and connect through a Wi-Fi network 1110. If a Wi-Fi network 1110 is unavailable, fallback logic 1100 specifies a hierarchy of further options to be tried, including Bluetooth low energy 1115, circuit switched wireless 1120 and a 3G wireless network 1125.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising a smartbox, the smartbox including:
a battery;
a sensor configured to detect a property of a medium of the smartbox;
a climate control interface configured to change the property;
a valve;
a processor;
a network interface coupled to the processor and configured to receive one or more operating parameters for the smartbox from a control server; and
a memory storing instructions which, when executed by the processor, cause the processor to:
receive a first indication of a charge of the battery;
receive, from the sensor, a second indication of the property; and
initiate transmission of a control input with respect to the climate control interface based on the one or more operating parameters, the first indication, and the second indication, the control input configured to control the valve.

2. The apparatus of claim 1, wherein the sensor is configured to sense a particular property that includes a temperature, a humidity, or a concentration of particulates associated with the medium.

3. The apparatus of claim 1, wherein execution of the instructions by the processor further causes the processor to:
determine a second operating parameter based on a utility window of content in a resealable storage enclosure of the smartbox; and
determine a second control input for the climate control interface based on the second operating parameter.

4. The apparatus of claim 3, wherein the utility window corresponds to a predicted period of time during which a content in the resealable storage enclosure remains fresh.

5. The apparatus of claim 1, wherein the medium comprises air or water.

6. The apparatus of claim 1, wherein the climate control interface comprises at least one of a flapper valve or a shutter.

7. The apparatus of claim 1, wherein an operating parameter of the one or more operating parameters corresponds to a temperature associated with the medium.

8. The apparatus of claim 7, wherein:
the property corresponds to a second temperature, and
the control input is configured to, responsive to the temperature being distinct from the second temperature, instruct the climate control interface to initiate adjustment of the medium to the temperature.

9. The apparatus of claim 1, wherein the sensor, the climate control interface, the processor, and the network interface are configured to be powered by the battery.

10. The apparatus of claim 1, wherein execution of the instructions by the processor further causes the processor to disable the network interface responsive to receiving, via the network interface, an operating parameter of the one or more operating parameters from the control server.

11. A method comprising:
receiving a first indication of a charge of a battery of a smartbox;
receiving, from a sensor of the smartbox, a second indication of a property of a medium of the smartbox;
receiving, from a control server external to the smartbox, one or more operating parameters for the smartbox; and
initiate transmission, by a processor at the smartbox, of a control input with respect to a climate control interface of the smartbox based on the one or more operating parameters, the first indication, and the second indication, the climate control interface configured to change the property by controlling a valve of the smartbox.

12. The method of claim 11, wherein the one or more operating parameters, the first indication, and the second indication are timestamped.

13. The method of claim 11, wherein operation of the climate control interface comprises opening a flapper valve.

14. The method of claim 11, wherein operation of the climate control interface comprises manipulating a shutter.

15. The method of claim 11, wherein operation of the climate control interface comprises activating a heater.

16. The method of claim 11, wherein operation of the climate control interface comprises activating a refrigerator.

17. The method of claim 11, further comprising:
receiving, at the processor of the smartbox, a third indication of the smartbox being positioned within a proximity of a particular device; and
responsive to one or both of the third indication and a release determination made by the processor, releasing a lock of a resealable storage enclosure of the smartbox.

18. A device storing instructions that, when executed by a processor, cause the processor to perform or initiate performance of operations comprising:
receiving a first indication of a charge of a battery of a smartbox;
receiving, from a sensor of the smartbox, a second indication of a property of a medium of the smartbox;
receiving, from a control server external to the smartbox, one or more operating parameters for the smartbox; and
transmitting a control input with respect to a climate control interface of the smartbox based on the one or more operating parameters, the first indication and the second indication, the climate control interface configured to change the property at least partially by controlling a valve of the smartbox.

19. The device of claim 18, wherein the operations include updating blockchain data responsive to a lock on a resealable storage enclosure of the smartbox being opened.

20. The device of claim 18, wherein execution of the instructions by the processor causes the processor to determine the control input based further on a particular property associated with contents of a resealable storage enclosure of the smartbox.

* * * * *